US00RE41187E

(19) United States
(12) Reissued Patent
Cooke

(10) Patent Number: US RE41,187 E
(45) Date of Reissued Patent: Mar. 30, 2010

(54) VARIABLE CLOCKED SCAN TEST CIRCUITRY AND METHOD

(76) Inventor: Laurence H. Cooke, 565 San Benito Ave., Los Gatos, CA (US) 95030

(21) Appl. No.: 12/047,408

(22) Filed: Mar. 13, 2008

Related U.S. Patent Documents

Reissue of:
(64) Patent No.: 7,234,092
Issued: Jun. 19, 2007
Appl. No.: 10/351,276
Filed: Jan. 24, 2003

U.S. Applications:
(60) Provisional application No. 60/387,683, filed on Jun. 11, 2002.

(51) Int. Cl.
*G01R 31/28* (2006.01)

(52) U.S. Cl. ..... 714/728; 714/739
(58) Field of Classification Search ..... 714/739, 714/728
See application file for complete search history.

(56) References Cited

U.S. PATENT DOCUMENTS

| | | | | | |
|---|---|---|---|---|---|
| 3,784,907 | A | | 1/1974 | Eichelberger | |
| 4,495,629 | A | | 1/1985 | Zasio et al. | |
| 4,503,537 | A | | 3/1985 | McAnney | |
| 4,728,883 | A | * | 3/1988 | Green | 714/734 |
| 4,855,670 | A | * | 8/1989 | Green | 324/73.1 |
| 5,485,471 | A | * | 1/1996 | Bershteyn | 714/739 |
| 5,485,473 | A | * | 1/1996 | Diebold et al. | 714/724 |
| 5,515,383 | A | * | 5/1996 | Katoozi | 714/732 |
| 5,654,971 | A | | 8/1997 | Heitele et al. | |
| 5,732,246 | A | | 3/1998 | Gould et al. | |
| 5,841,788 | A | | 11/1998 | Ke | |
| 5,867,507 | A | | 2/1999 | Beebe et al. | |
| 5,991,898 | A | | 11/1999 | Rajski et al. | |
| 5,991,909 | A | | 11/1999 | Rajski et al. | |
| 6,237,122 | B1 | | 5/2001 | Maki et al. | |
| 6,324,652 | B1 | | 11/2001 | Henderson et al. | |
| 6,327,687 | B1 | | 12/2001 | Rajski et al. | |
| 6,606,713 | B1 | | 8/2003 | Kubo et al. | |
| 2002/0069387 | A1 | | 6/2002 | Hapke | |
| 2002/0099992 | A1 | * | 7/2002 | Distler et al. | 714/738 |
| 2002/0194565 | A1 | * | 12/2002 | Arabi | 714/729 |

FOREIGN PATENT DOCUMENTS

WO 03/075028 A1 9/2003

OTHER PUBLICATIONS

V. Agrawal et al., "A Tutorial on Built–In Self–Test, Part 1: Principles," IEEE Design & Test of Computers, pp. 73–82, Mar. 1993.
C. Barnhart et al., "OPMISR: The Foundation for Compressed ATPG Vectors," IEEE ITC International Test Conference, Paper 27.4, pp. 748–757, Oct. 30–Nov. 1, 2001.
V. Agrawal et al., "A Tutorial on Built–In Self–Test, Part 2: Applications," IEEE Design & Test of Computers, pp. 69–77, Jun. 1993.

* cited by examiner

*Primary Examiner*—M. Mujtaba K Chaudry
(74) *Attorney, Agent, or Firm*—Connolly Bove Lodge & Hutz LLP

(57) ABSTRACT

A technique to reduce the test data volume and number of scan shift clocks per test pattern by combining the scan inputs with existing values in scan chains and inserting them at additional bit positions along the scan chains in order to reduce the number of shift clocks required to achieve required values at plurality of scan bit positions, and by using multiple taps from the scan chains to form a checksum in order to reduce the number of scan shift clocks to capture test results.

10 Claims, 23 Drawing Sheets

VARIABLE CLOCKED SCAN TEST CIRCUITRY AND METHOD

Matter enclosed in heavy brackets [ ] appears in the original patent but forms no part of this reissue specification; matter printed in italics indicates the additions made by reissue.

*CROSS-REFERENCE TO RELATED APPLICATION*

*This application claims priority to U.S. Provisional Patent Application No. 60/387,683, filed on Jun. 11, 2002.*

FIELD OF THE INVENTION

The present invention is related to digital logic testing, particularly additions to scan based digital logic testing, which uses check-sum or signature register logic and exclusive or operations on serial shift string logic, and software techniques to reduce test data volume and minimize test time.

BACKGROUND AND SUMMARY OF THE INVENTION

Scan based test technology provides a way to structurally test digital integrated chips, as described by Eichelberg in U.S. Pat. No. 3,784,907, and Zasio et al. in U.S. Pat. No. 4,495,629. These and other patents teach that when all internal state variables are scanned, the remaining logic of an integrated circuit can be fully tested as if it were purely combinatorial. This approach provides significantly more predictable results compared to the uncertain result of obtained using sequential testing. Unfortunately, scan testing is time consuming. For each test pattern, the entire internal state of the integrated chip must be scanned in, one bit per clock cycle, before a system clock can be issued, and then the resulting internal state must be scanned out, again, one bit at a time. Earlier, the number of clock cycles necessary to perform scan-based testing was not considered a problem since the scan-in and scan-out cycles of successive test patterns were overlapped, the number of test patterns was small, and the scan strings (also termed "scan chains") were not very long. On the other hand, present day designs may contain as many as 250,000 to 2.5 million internal state variables that require scan-in for initialization and scan-out for observing their values after each test pattern. Thus, total number of test clock cycles and the number of bits of scan-based test data for large IC's have major impact on memory requirements for testers and total test time, which is crucial in determining IC test costs.

Several techniques were developed to help combat the increased test data volume and tester clock cycle requirements. For example, Built-in self test, or BIST as described in Agrawal, V. et al., "A Tutorial on Built-In Self Test, Part 1: Principles", IEEE Design & Test of Computers, March 1993, and Agrawal, V. et al., "A Tutorial on Built-In Self Test, Part 2: Applications", IEEE Design & Test of Computers, June 1993 have been suggested to help reduce the amount of time necessary to load and unload the scan chains. BIST targets loading the BIST engine with a starting state that creates the initial test vector, and then clocking the system as many times as necessary to get the desired coverage so that the final result may be scanned out to determine its check-sum. During its operation, the BIST engine creates a new pseudo-random test vector for each new test cycle and the check-sum is used as a condensed version of the result that has been reduced to a few bits. By reducing the need for external test data, BIST significantly improves the test data volume, through it does not produce good tests for arbitrary logic. As a result, it is primarily only used for memories and similar regular structures, where acceptable test coverage may be achievable. Furthermore, BIST leads to increased test time (i.e., total number of test-clock cycles) since it still requires each pseudo-random test pattern to be scanned-in to, and the results to be scanned-out of, the scan chains and, typically, more patterns are required to achieve coverage attainable using deterministic test patterns, such as using an automatic test pattern generator (ATPG) program.

This has still left unsolved the problem of applying regular scan-based test patterns in a faster way.

The most common technique to reduce test time is to break up the single long scan string into multiple shorter scan strings. While this technique reduces overall test time, it increases the number of pins required for the scan-in of the internal states since each individual scan chain requires a separate pair of scan-in and scan-out pins. One approach to reduce the total number of scan-in and scan-out pins is to eliminate all external (to the IC device under test) scan-out pins and use an internal signature register to capture the scan-out values. For example, see the approach described by Barnhart et al in "OPMISR: The Foundation for Compressed ATPG Vectors", ITC International Test Conference, paper 27.4, Baltimore Md., Oct. 30-Nov. 1, 2001. A different approach, which aims at reducing the number of external scan-in pins is described by Rajski et al. in U.S. Pat. No. 5,991,909. In this approach, data compression techniques are used to codify the input scan in values in such a fashion that an on-chip data decompressor can be utilized to expand data received at "n"-many scan-in terminals so it can be applied as input to "m"-many scan-in chains. Thus, by choosing "m" greater than "n", it is possible to implement "m"-many internal scan chains which are fed serial data from only "n"-many scan-in pins. Increasing the effective number of internal scan chains which are scanned in parallel results in shorter length chains and reduces the total test time since fewer shift cycles are needed to scan the chains completely. Rajski uses an Exclusive-OR gating structure to combine (i.e., compress) the scan-out values from the m-many internal scan chains into n-many scan-out pins. By using a "decompressor" at the scan inputs and a "compressor" at the scan outputs, Rajski translates the m-many internal scan chains into n-many externally visible scan chains and effectively loads/unloads the scan chains by dealing with the shorter length of the m-many internal chains while using the smaller number of n-many scan-in/scan-out signal pin pairs. This technique reduces the test time and the number of test pins by creating m-many internal scan chains, which are shorter (by a factor of m/n) than the n-many externally visible scan chains. However, this technique still requires that each of the internal scan chains must still be completely scanned in order to load each test pattern and simultaneously unload test results from the previous test pattern.

The present invention reduces this fundamental scan shifting time further by utilizing the results that already exist in the internal scan strings from the prior pattern in order to form the next test pattern. The present invention can be implemented either on its own or together with other techniques that may be used to increase the number of internal scan chains. This is possible based on the observation, which is known to those who are knowledgeable in the state of art, that most of the test patterns require a small percentage (typically less than 10%) of the internal state variables to be set to pre-determined values, and furthermore, that the expected results can be captured into even fewer number internal state variables. This is due to the fact that even in large IC's that have very many internal state variables that are scannable, the first few test patterns are often successful in detecting a high percentage (up to 85%) of the faults. The remaining large percentage (greater than 90%) of test patterns are targeted to detect a small percentage (e.g. 15%) of all of the faults in the target IC that remain to be detected. Many of the state variables are not utilized in these patterns since the faults that require these state variables to be set to specific values have already been detected.

In each test vector, state variables that must be set to specific values are called "care inputs". Accordingly, the present invention shifts new values into the scan string (or strings) until all of the "care inputs" of the present test vector have been simultaneously set to their required values, either by providing the required values using serial scan-in pins, or by utilizing the existing values in the scan strings that are left over results from the application of a previous test. Utilizing existing values in the scan strings enables scanning less than the entire length of the scan chain and therefore reduces the number of scan cycles and the total test time. In each test result vector, state variables that have captured values that are material in detecting some of the remaining faults in the target IC as called "care outputs". Following the serial shift operations to establish the next test pattern and the subsequent capture of the test results, captured test results are only shift towards the outputs of the scan chains for as many bit positions as needed in order for the "care outputs" to be captured in a check-sum using multiple taps from each scan string. Accordingly, the present invention shifts test results out of the scan chains until all of the "care outputs" for the given results vector have been captured via check-sum circuitry into a signature register. The number of serial shift cycles necessary for each test pattern is variable and is dependent on the number of shift cycles necessary to achieve the desired values of the "care inputs" and the number of shift cycles necessary to capture the "care outputs" in a checksum or signature register. A probabilistic analysis of this approach, presented below, shows the target IC can be tested using less than ⅕ of the shift clock cycles being required in previous scan techniques. Test time is significantly reduced with minimal overhead to any of the existing techniques.

The primary objective of the present invention is to reduce the volume of test data, as defined by the number of scan-in values and scan-out values as well as reducing the application time, as expressed in number of test clock cycles necessary to exchange the test data between the target IC and an external tester. Present invention achieves this objective in two ways. First, test results for each test vector are captured on the "care outputs" of each test vector and the captured values are observed by performing a scan-out of the internal scan chains until all "care outputs" have been observed. Since a scan-out of the internal scan chains is avoided after all of the "care outputs" have been observed (but before all of the bits of the internal scan chains have been scanned out) the total number of scan-out clock cycles and the scan-out test data volume are reduced. Furthermore, the observation of the "care outputs" is accelerated by selecting "tap-out" points (i.e., bit positions along the scan-chains) and feeding data from the "tap-out" points into a Multi-Input Signature Register (MISR). This technique reduces the maximum number of scan-out cycles needed to observe all of the "care outputs" to the maximum bit separation between any two consecutive "tap-out" points (or between the first "tap-out" point and the serial "scan-in" input terminal or the last "tap-out" point and the "scan-out" terminal). This technique allows the designer to select the number of "tap-out" points in order to achieve the desired reduction in the number of scan-out cycles and the corresponding reduction in the overall scan-out data volume.

Secondly, the "care inputs" for each test vector are set using either the values already present in the internal scan chains, or a combinatorial combination of the values present in the internal scan chains and the serial data at the scan-in terminal to each internal scan chain. A value that is already present in the scan chain can be seen as representing a value applied at the serial scan-in terminal at "k" cycles previous to the present, where "k" is the number of bit positions between the bit position that contains said value and the serial scan-in terminal. By using the stored value in setting a "care input" to the value required by the test vector, the initial "k" shift cycles are bypassed, accelerating the overall scan-in process. Furthermore, since scan-in values are not needed for the initial "k" cycles, the total scan-in data volume is also reduced. Data from a common scan-in terminal or multiple data from several independent scan-in terminals are fed forward to merge with the data already in the scan chain. This technique bypasses sections of the scan-chain so that bit positions further away from the starting point of the scan chain receive values from the starting point of the scan chain more quickly. By accelerating the movement of serial data to the downstream positions of the scan chain, the number of scan-in cycles necessary to set a "care input" value from the serial input terminal is reduced.

In addition to the acceleration of the observation of the "care outputs" and the setting of the "care inputs", the observation of the "care outputs" and the setting of the "care inputs" do not require an identical number of scan cycles. This is a feature not found in state-of-art scan techniques for applying pre-determined and/or deterministic test vectors. Thus, the number of "tap out" points can be different from the number of "feed forward" positions, as long as for each test vector the number of scan cycles to set the "care inputs" is at least as large as the number of scan cycles needed to observe all of the "care outputs" since these two operations are performed in overlapped fashion. The "care outputs" from the last test vector are being observed while the "care inputs" for the next test vector are being set. Hence, the total number of scan cycles at each vector may be different. All existing scan-based test methods up to now require the same number of scan cycles for all scan-out and scan-in operations. The cycle count is equal to the number of bits along the scan chain so that it is constant for all test vectors. This approach is different from dynamically reconfiguring the scan chains so that an increased number of shorter scan chains may be formed and operated in parallel. In contrast to the present invention, dynamic reconfiguration achieves only a change in the total number of scan cycles without achieving a reduction in the total scan-in/scan-out data volume. Indeed, the present invention can be applied on top of any existing serial scan structure and still achieve reductions of test data volume and scan cycle count.

A probability analysis of the technique presented here is also provided. The analysis assumes a fixed percentage of "care inputs" randomly chosen and set to randomly chosen values. It calculates the expected number of serial scan operations for a given vector necessary to simultaneously set the "care inputs" to their selected values. Indeed, the probability calculations show serial scan-in cycles which are much shorter than the total length of the internal scan chain. These results strongly suggest that pseudorandom, rather than deterministic values may be fed into the serial scan-in terminal (or multiple scan-in terminals). Pseudorandom values can be created very easily using an on-chip generator, such as a Linear Feedback Shift Register. Thus, the present invention teaches a technique for use in Built-In Self Test (BIST) applications, as well as for test applications using pre-determined test vectors.

In summary, the present invention provides for the capture of test results from the "care outputs" of each test vector while all of the "care inputs" of the next test vector are set to their required values with a reduced number of serial shift operations. This results in a reduced volume of test data for testing the target device. Additionally, the present invention provides for feed-forward paths within the scan chains to further reduce the number of serial shift operations necessary to set all of the "care inputs" to the values required for each test vector.

In much of the specification below, descriptions are given with respect to a serial scan chain. Where a target IC implements multiple (parallel) internal scan chains, the descriptions given here should be taken to apply to each serial scan chain. Furthermore, features are described that allow starting and stopping the serial shift operations along the individual scan chains separately from the other chains so that the chains can be operated independently. This allows serial shifting of each scan chain until all of its "care outputs" have been observed and all of its "care inputs" have been set to the required values without requiring that the total number of shift cycles be the same for all scan chains.

DESCRIPTION OF SPECIFIC EMBODIMENTS

Figure 19:
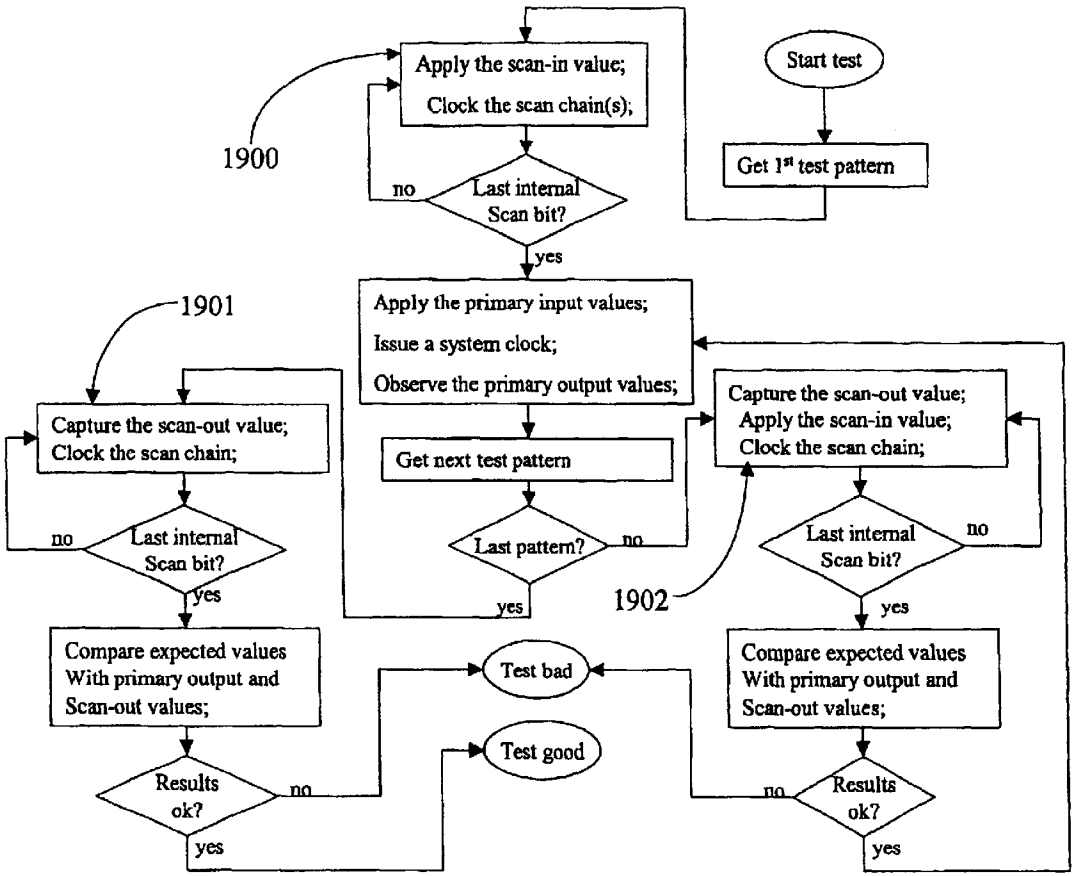
FIG. 19 is a flowchart of a conventional test procedure.

Traditional scan test techniques follow a process similar to the flowchart shown in FIG. 19. Typically the first pattern is only scanned in (step 1900, the last pattern is only scanned out (step 1901, and all patterns in between are scanned out while the next pattern is scanned in (step 1902.

Figure 1:
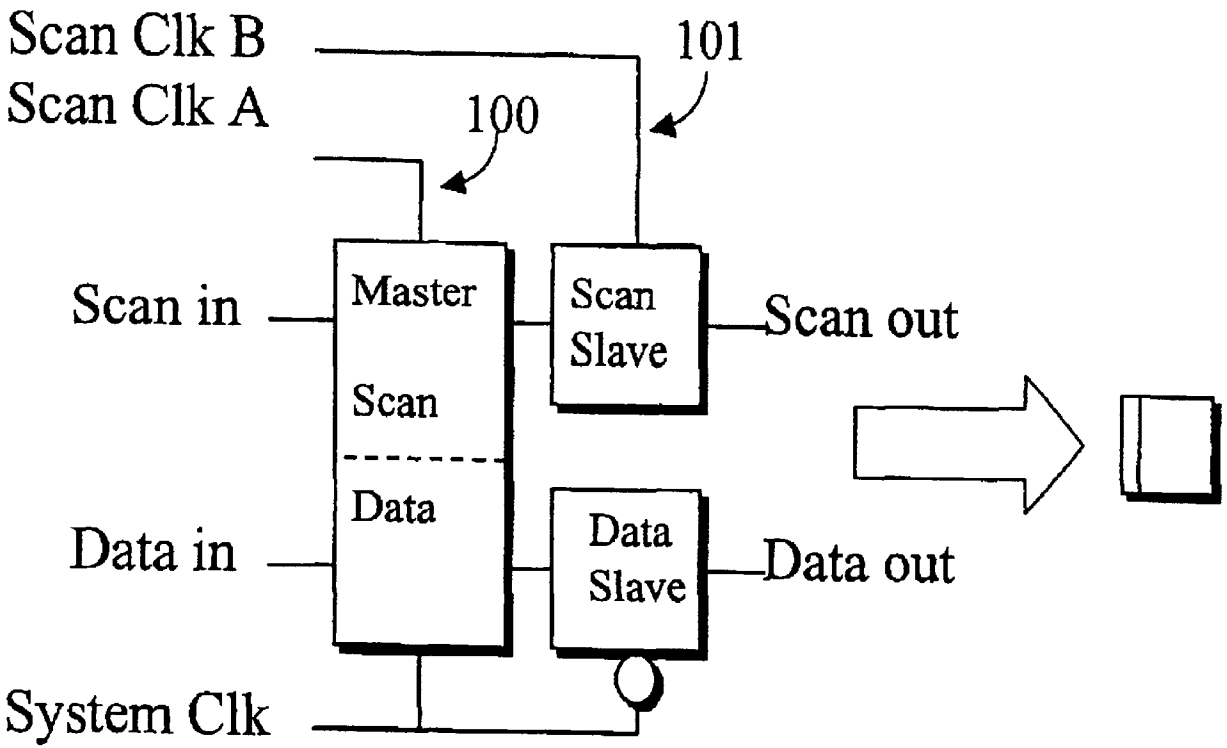
prior art Figure 1
FIG. 1 is a block diagram of one type of prior art scan flip-flop.
Figure 2:
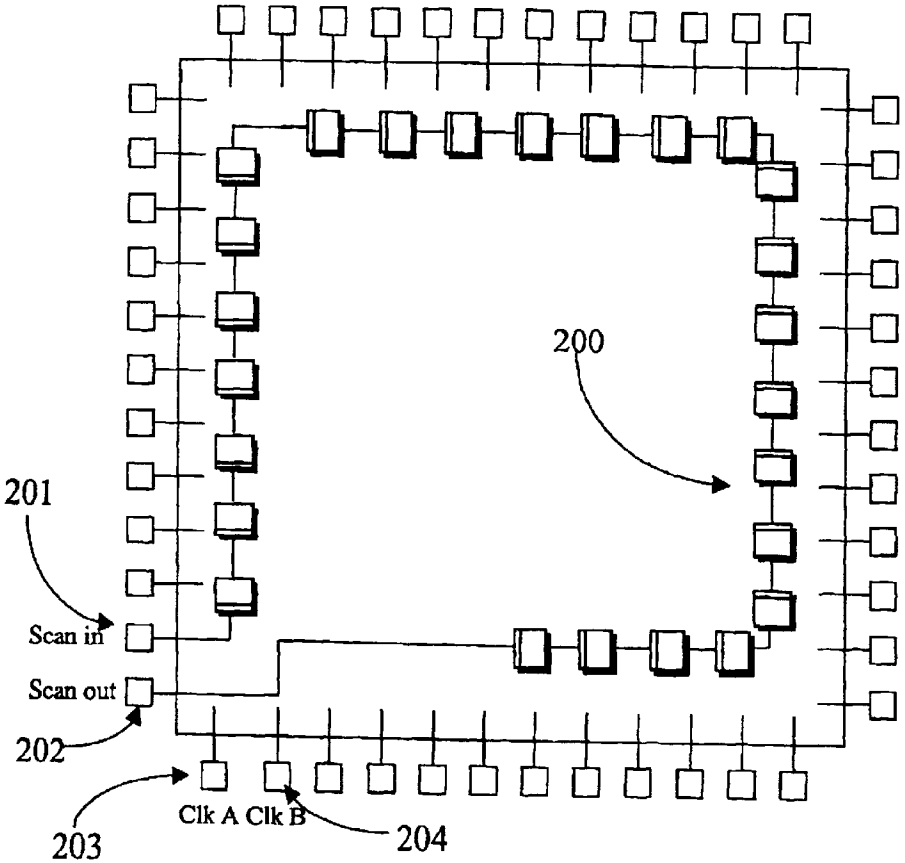
prior art Figure 2
FIG. 2 shows the prior art organization of a single scan string of scan flip-flops for testing all internal states in an integrated circuit.
Figure 15:
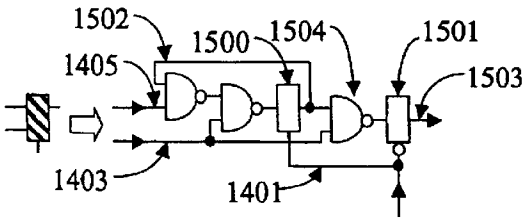
FIG. 15 illustrates the details of the clock enable logic of FIG. 14.

For example, if there are 25 internal state variables in a chip, all connected into a single scan string 200 such that data is loaded via a scan-in input pin 201 and extracted via a scan-out output pin 202 as shown in FIG. 2, and 15 test vectors are to be applied, then the tester would issue 25+"1"+(25+1)×14+25=415 test clock cycles (400 scan clock cycles and 15 capture clock cycles) to test the chip. These may be single clock pulses or in the case of using a scan flip-flop, as shown in FIG. 1, a test clock cycle is a pulse on Clk A line 100 followed by a pulse on Clk B line 101 from primary input pins 203 & 204.

Basic Variable Scan Clocking Techniques

In a preferred embodiment of the present invention, the first few patterns are scanned and tested in the same fashion as described above because many (or all) input values may be necessary to catch faults. After the first few patterns, only a small (e.g. less than 10%) of the internal states variables may need to be set to specific values in order to catch the remaining faults. Furthermore, only a small percentage (e.g. less than 10%) of the captured result values may need to be checked. Accordingly, the majority of the test patterns may be applied using the modified procedure shown in FIG. 20. The only difference is to stop shifting when the required results are captured and the required inputs are set, decision step 2000, where the required results are captured in a signature register, decision step 2001.

To illustrate this process, consider an internal state vector (starting from the left) as a string of don't care values signified by * and required "care input" values signified by "1" or "0", as shown below:

0******1****

EXAMPLE 1

In this example, the $3^{rd}$ and $19^{th}$ bits on the scan string must be set to "0" and "1" respectively as "care-inputs" for the present test vector, but the remaining scan bit positions may be set to any value. Furthermore, if the present state of the scan string is:

0111011010011101111001101

EXAMPLE 1a

It is seen that the $3^{rd}$ bit position must be replaced with a "0", while the $19^{th}$ bit position is already a "1". Thus, if we denote the new scan-in values with a "*", the shifting proceeds as follows:

0111011010011101111001101

*0111011010011101111001 10

**0111011010011101111001 1

EXAMPLE 1b

It is observed that following the second shift operation, the $3^{rd}$ position is set to a "0" and the $19^{th}$ position is set to a "1", and both of the input conditions have been met.

In a similar fashion, the output results may be viewed as a vector with don't cares where none of the target fault conditions have been propagated (i.e., caught) and either "1" or "0" values where the target faults have been propagated to. Such a vector may look like this:

10********

EXAMPLE 1c

Figure 3:
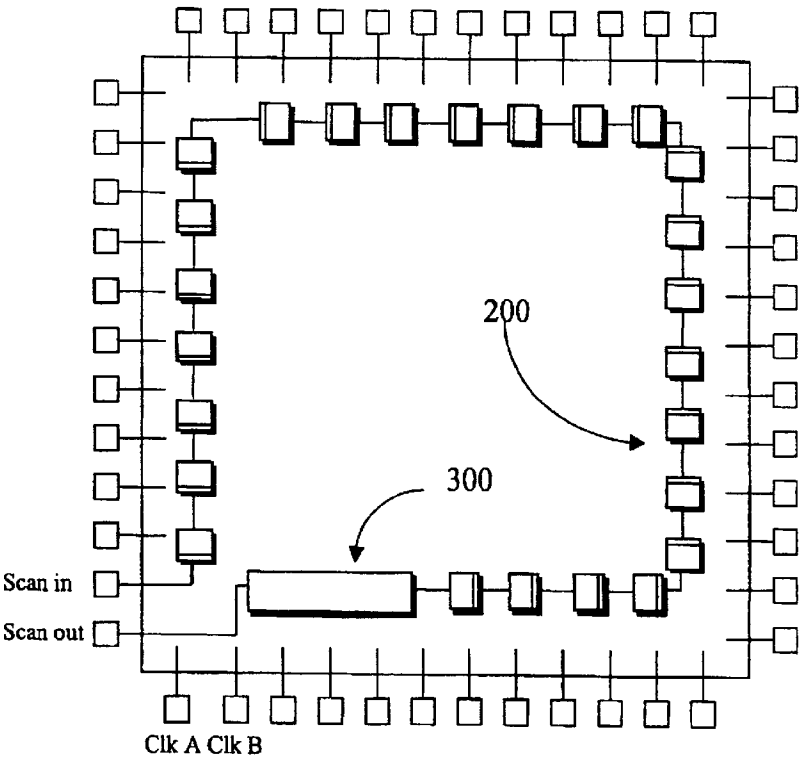
prior art Figure 3
FIG. 3 shows a prior art signature register at the end of the scan string of FIG. 2.
Figure 4:
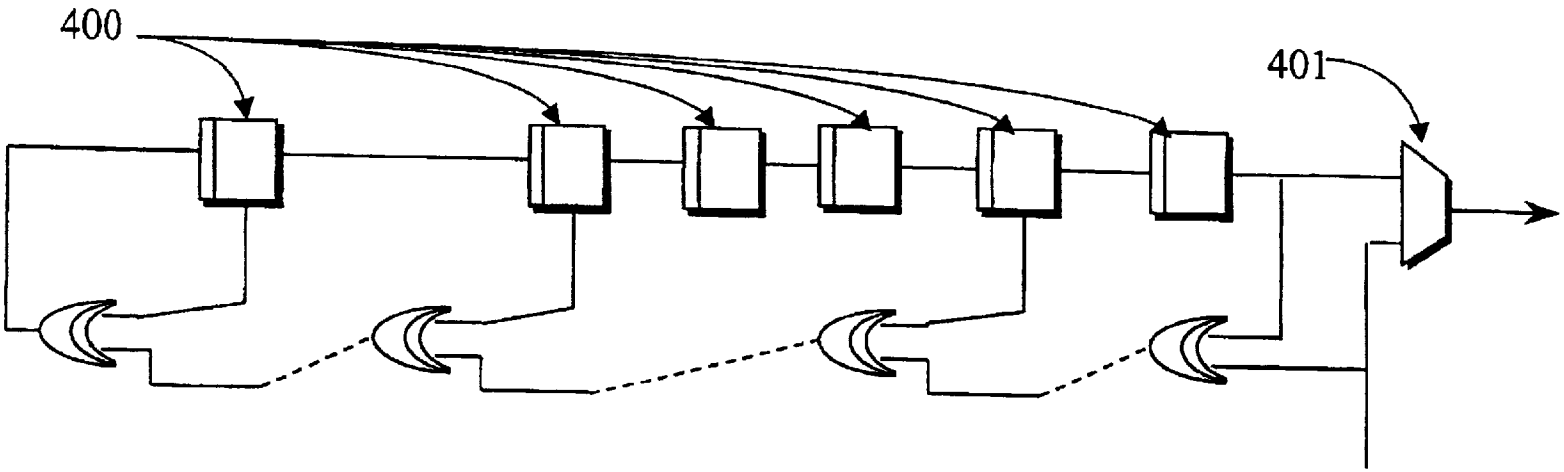
prior art Figure 4
FIG. 4 is a block diagram of a signature register.
Figure 5A:
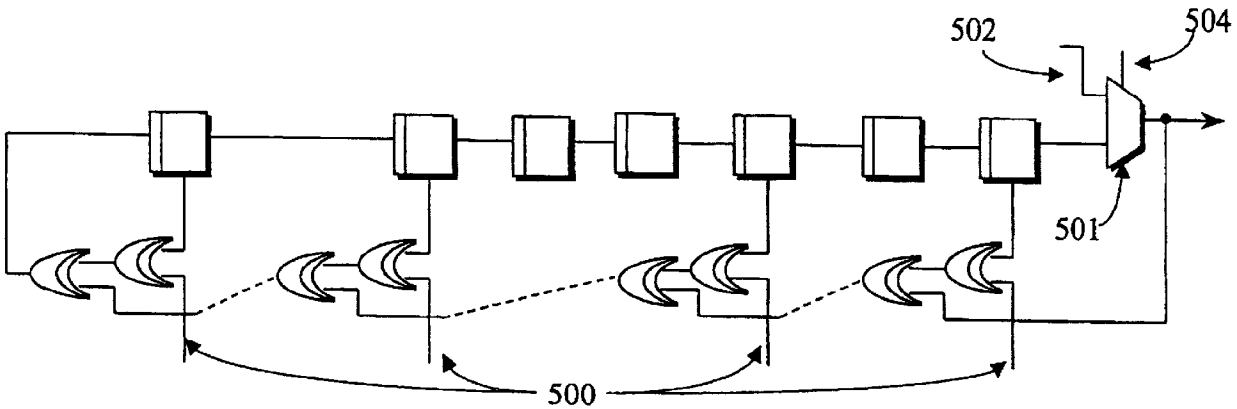
FIG. 5a is an embodiment of the present invention by adding multiple taps to the signature register in FIG. 4.
Figure 5B:
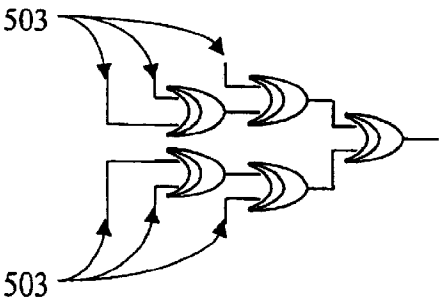
FIG. 5b is an alternate embodiment of the present invention by adding multiple taps to the single output check-sum in FIG. 4
Figure 6:
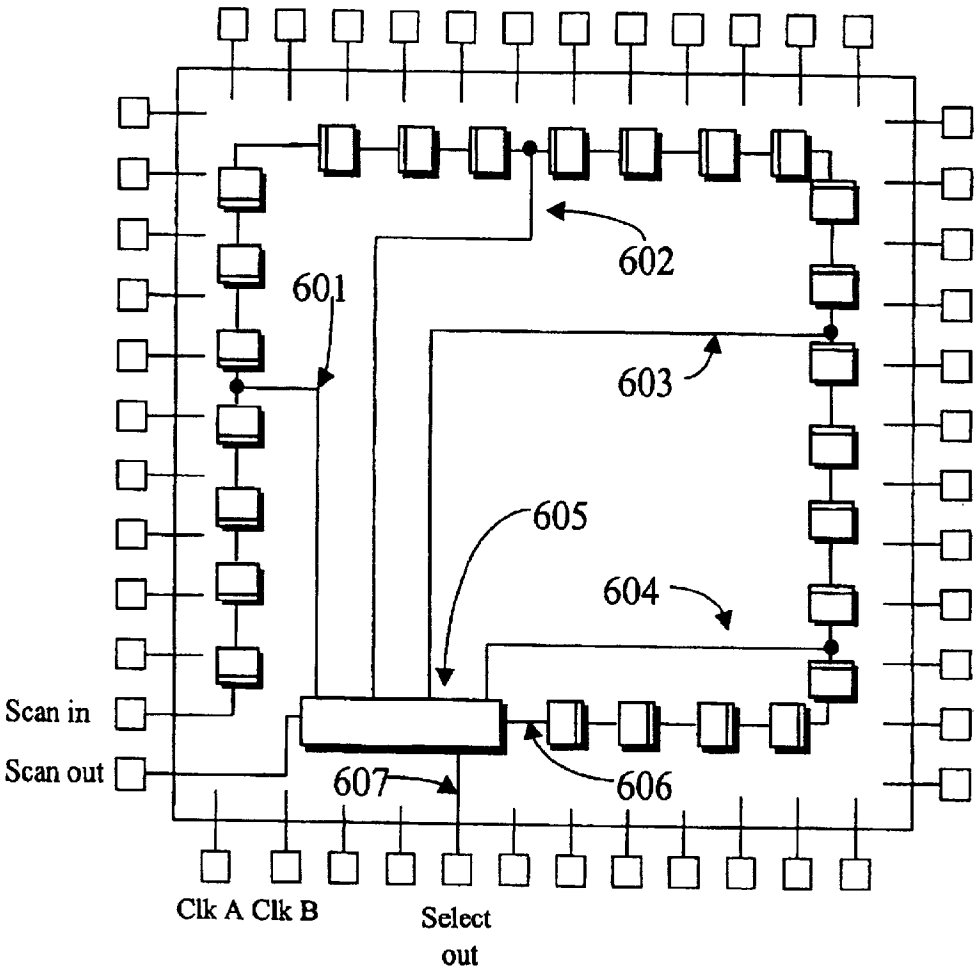
FIG. 6 is another embodiment of the present invention with the addition of multiple taps from the scan string to the check-sum or signature register in FIG. 3.

In this case there are three "care-outputs" that are captured on the $3^{rd}$, $10^{th}$ and $18^{th}$ bits. A brute-force approach for observing the values on all of the "care-output" bit positions is to perform 22 shift operations so that the $3^{rd}$ bit's value reaches the Scan out pin 202. However, a more efficient way is to capture the results on a modified signature register, such as the signature register shown in FIG. 5a, or a multiple input check-sum such as shown in FIG. 5b. Previously, as shown in FIG. 3, single input check-sum or signature registers 300 were placed at the end of scan strings 200, thereby requiring that the entire length of the scan-chain be shifted in order to form a signature of the present contents of the scan chain. FIG. 4 shows a typical single-input signature register that would be connected at the end of the scan chain, as shown in FIG. 3. FIG. 5a shows an example of an alternate MISR configuration that accepts multiple input streams 500 into the signature register, and FIG. 5b shows an example of a similar configuration that accepts multiple input streams 503 into a check-sum. According to the invention, it is better to use a check-sum or MISR with multiple inputs or taps as shown in FIGS. 5a and 5b since this allows the capture of the "care-outputs" simultaneously from multiple bit positions of the scan chain into the MISR or check-sum without having to scan out the complete length of the scan register, as illustrated in FIG. 6. In FIG. 5, the multiplexor 501 allows the contents of the 7 bit signature register to be initialized from a separate input 502. In yet another embodiment the output 606 of the last register of the scan chain in FIG. 6 is connected to the input 502 in addition to one of the inputs 500, both of the signature register in FIG. 5a, and the Select Out line 607 in FIG. 6 is connected to the multiplexor control line 505 in FIG. 5a. In this embodiment either the contents of the signature register or the actual contents of the scan string are selected by setting the Select Out line 607 to the proper state. When the results of initial patterns have unknown values due to the unknown initial conditions within the design, the checksum or signature of the results may also be unknown. When the results of simulation of the test vectors have unknown values, the Select Out line 607 is set to shift out the actual contents of scan string. On these patterns all bits should be shifted out, while shifting in all bits for the next pattern.

Using the MISR as shown in FIG. 5A, or check-sum as shown in FIG. 5b, only the locations of the tap points, going to the check-sum or signature register, are needed to determine if all of the "care-output" values have been captured. As shown in FIG. 6, the tap points are on the $4^{th}$ bit, (tap point 601), $10^{th}$ bit, (tap point 602), $16^{th}$ bit, (tap point 603), $20^{th}$ bit, (tap point 604), and $25^{th}$ bit, (tap point 605), or can be viewed as a string like the following:

0001000001000001000100001

Where "1" marks the tap positions (including the last bit of the chain). This vector can be displayed next to the "care-output" vector as follows:

| | |
|---|---|
| 0001000001000001000100001 | scan chain positions connected to the MISR |
| **1******0*******1******* | scan chain care-output positions |

EXAMPLE 1d

Thus, the maximum distance between any "care-output" position and the position of the closest MISR tap position after that, determines the maximum number of shift cycles necessary to capture all of the "care-output" values in the MISR register. For the Example illustrated here, only 3 shift cycles are necessary, as shown below:

| | |
|---|---|
| 0001000001000001000100001 | tap positions feeding the MISR (check-sum) register |
| **1******0*******1******* | starting positions of care-output values |
| ***1******0*******1****** | care-output after 1st shift |
| ****1******0*******1***** | care-output after 2nd shift |
| *****1******0*******1**** | All care-outputs received at MISR after 3rd shift |

EXAMPLE 1e

In reality, even those bit positions that are not "care-outputs" for the given test vector will attain known values after the capture clock cycle that causes the "care-output" bit positions to be loaded with the values that carry failure information. For example, the complete scan chain after the capture operation may contain the value as shown below:

| | |
|---|---|
| **1******0*******1******* | care-outputs after capturing the test results |
| 0111011010011101111001101 | entire scan chain after capturing the test results |

EXAMPLE 1f

Since three shift cycles are needed to capture all of the "care-outputs" of the previous test result the next test vector cannot be applied before at least 3 shift cycles so that all of the "care-outputs" can be captured in the MISR before they may be overwritten by new test results. Furthermore, all of the "care-inputs" must be established at their required values before the next test vector is ready. The starting state for the scan chain so it may be shifted in order to set the "care-bits" is the state resulting after the capture operation for the previous test. For the Example illustrated above, the starting state of the scan chain is:

0111011010011101111001101 entire scan chain before starting shift operations

EXAMPLE 1g

After the minimum count of 3 shift cycles as described above, the can chain contents are:

***01110110001110111 1001 scan chain after first 3 shift operations

EXAMPLE 1h

It is seen that "care-input" value at bit position 19 is already set to the required value of logic 1. Furthermore, "care-input" value at bit position 3 is dependent on the scan-in value on the $1^{st}$ shift period. Since, the $2^{nd}$ and $3^{rd}$ scan-in values are not needed to set the value at any of the "care-input" positions, these can be set arbitrarily to any value. In the on going example these are set to logic "1" and "0", respectively. Thus, the scan-vector after 3 shift operations is given by:

0110111011010011101111001 scan chain after first 3 shift operations

EXAMPLE 1i

This shows that using the technique described above, it is possible to apply a new test pattern after only 3 shift cycles instead of shifting the entire length (i.e. 25 bits) of the scan chain, reducing the total number of test cycles necessary for the test.

It should be noted here that the signature register in FIG. 5a consists of feedbacks to reduce the probability of aliasing of the captured data, but as the captured string length grows, the number of signature register bits may also have to grow. Secondly, the test may not stop on the failing pattern if the number of shifted bits is less than the size of the signature register, because the entire contents of the signature register was not shifted out. To prevent this, in one embodiment of the present invention, the minimum shifting length is required to be the size of the signature register. Alternatively, if the check-sum such as shown in FIG. 5b is used, aliasing of the captured data may occur when the fault is simultaneously captured in an even number of taps. If this occurs either, the shifting should continue until the fault is caught on a later tap, or the fault should be considered not caught. Fault simulation of the check-sum may be necessary to insure proper capture of faults on the "care outputs".

In another embodiment of the invention, multiple scan strings may are employed. There are two alternative clocking structures that can be employed with multiple scan strings:

1) each scan string is operated using an independent clock, or 2) all scan strings are operated on a common clock.

If they have independent clocks, each scan string can be shifted as described above, independently of the other scan strings, except that all shifting must be completed before the system clock can be issued to capture the test results in the scan strings.

In the second case, the "care-output" values from all scan strings should be captured and the "care-input" values for all scan strings must be set before the shifting is stopped. Whereas this case typically requires longer shift cycles than the first case, the upper bound for the number of shift cycles is the same as in prior art.

In yet another embodiment of the present invention, the taps are spaced along the scan strings according to any one of the following conditions:

1) to evenly distribute the number of scan stages between taps, or 2) to evenly distribute the number of "care-outputs" (i.e. observable faults) between taps, or 3) to minimize the number of shifts required to capture checksum of results based on the tests applied.

Test vectors may be created according to the present invention using several different approaches. With minor modifications, existing test generation techniques may be used to create scan based test vectors. Typically, techniques for scan-based testing first target a specific fault and generate a test vector to detect it. The generated test pattern specifies the required values at the "care-inputs" and also specifies the expected values to be observed at the "care-outputs" after the capture clock is applied to determine whether the test has passed. Next, all of the unused scan positions may be filled with pseudorandom values and the effect of the entire test pattern may be simulated to determine the expected values at all of the scan positions after the capture clock. In one embodiment of the present invention, test generation can be achieved using the following process:

1) Apply existing test generation techniques, but for each created pattern set all of the remaining unspecified values in scan positions to "unknown" states.

2) Create a set of results vectors (i.e., results after the capture operation) where the unknown input values are used along with the known input values in a simulation of the capture operation, to produce a results vector with known and unknown values. Fill in "unknown states" in the input values of the first vector, and simulate.

3) For each subsequent test in the test pattern perform a shift simulation of the test results vector, until all of the "care-outputs" in the test results vector have been captured, either in a checksum or in a signature register and all "care-inputs" of the next test vector have been set to their required values. Then simulate to obtain new outputs.

4) Keep the shift count and the new serial input values for each new test in the test pattern set.

5) Convert the scan patterns to the appropriate tester format.

In yet another embodiment one or more of the following improvements may be applied to the test generation process:

1) The resulting vectors may be sorted to minimize the number of shift clocks between patterns. This is done by simulating the first pattern, and comparing each subsequent pattern to the resulting values as described above to get a shift count, then choosing from the patterns with the lowest shift count for the next pattern, and repeating until all patterns have been chosen. If there is more than one pattern with the lowest shift count, sorting the rest of the patterns against each candidate pattern, and choosing the original pattern with the lowest sum of the original shift count or shift count sum and the next shift count, recursively repeating the process until only one candidate remains.

2) After generating the first test, all subsequent tests are created by fault simulating the results having successively shifted the results in the manner prescribed above, picking the resulting test with the highest fault count-to-shift ratio.

3) Where multiple outputs catch the desired faults, choose the required output vector, which minimizes the number of shifts for the next test.

Figure 7:
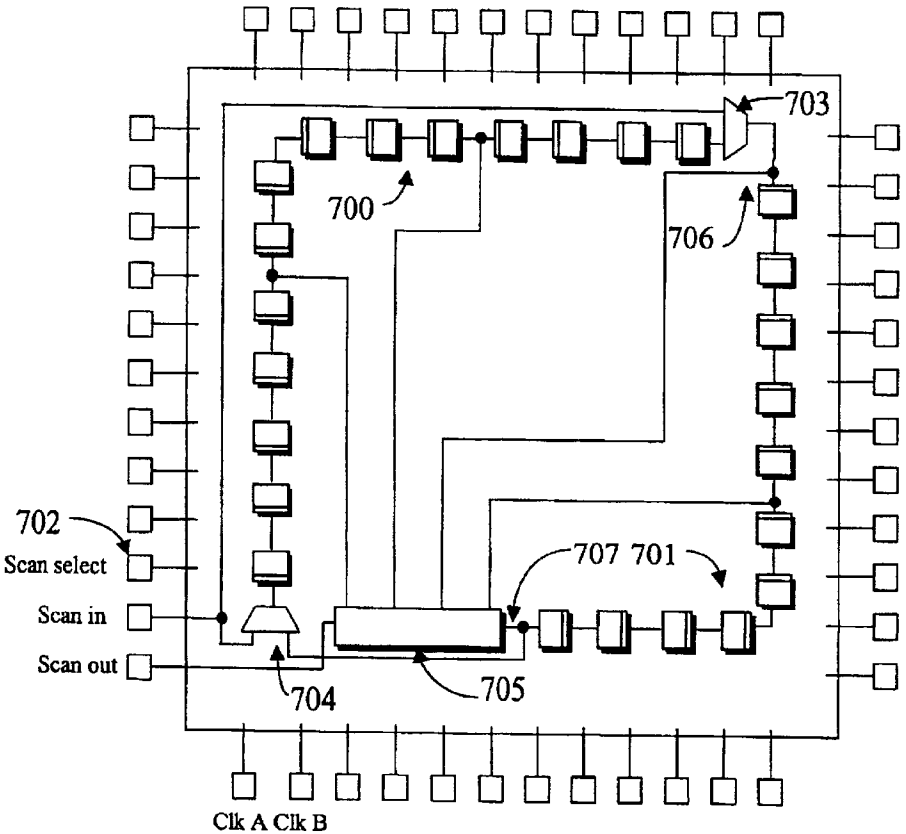
FIG. 7 is another embodiment with selectable sub-string ordering added to the test circuitry of FIG. 6.

In yet another embodiment, any single scan string can be modified as shown in FIG. 7 into two sub strings 700,701 whose order of shifting can be reversed. With the addition of a single select line 702 to a pair of multiplexors 703,704, either the first half connects and shifts into the second half of the scan string, or the second half connects into the first half. In both cases there are tap connections to the check-sum, or signature register 705 at the end of each half scan string 706,707. Since the tap points don't change there is no advantage for reducing output vector capturing, but there is an advantage for input vectors because the shifting of new values can start at the beginning or in the middle of the scan string. For example:

****0**0****1*1** required input vector 011011000100000101011001 0 initial results vector

**********0110110 18 shifts to match requirements

Now reversed yields

****0**0****1*1 required input vector 011011000110000101011001 0 initial results vector 01100100110110*****0101 8 shifts to match requirements

EXAMPLE 2

Note that the choice of the order of shifting the segments is set prior to beginning shifting. Simulation of the vectors in both states determines which matches the input requirements in the fewest shifts.

In yet another embodiment the select line is toggled as necessary to order the shift sequence of new and old values to minimize the number of shifts.

****0**0****1*1** required input vector 011011000110000101011001 0 initial results vector

******00110110001100*0101 7 shifts to match requirements

EXAMPLE 3

Figure 8:
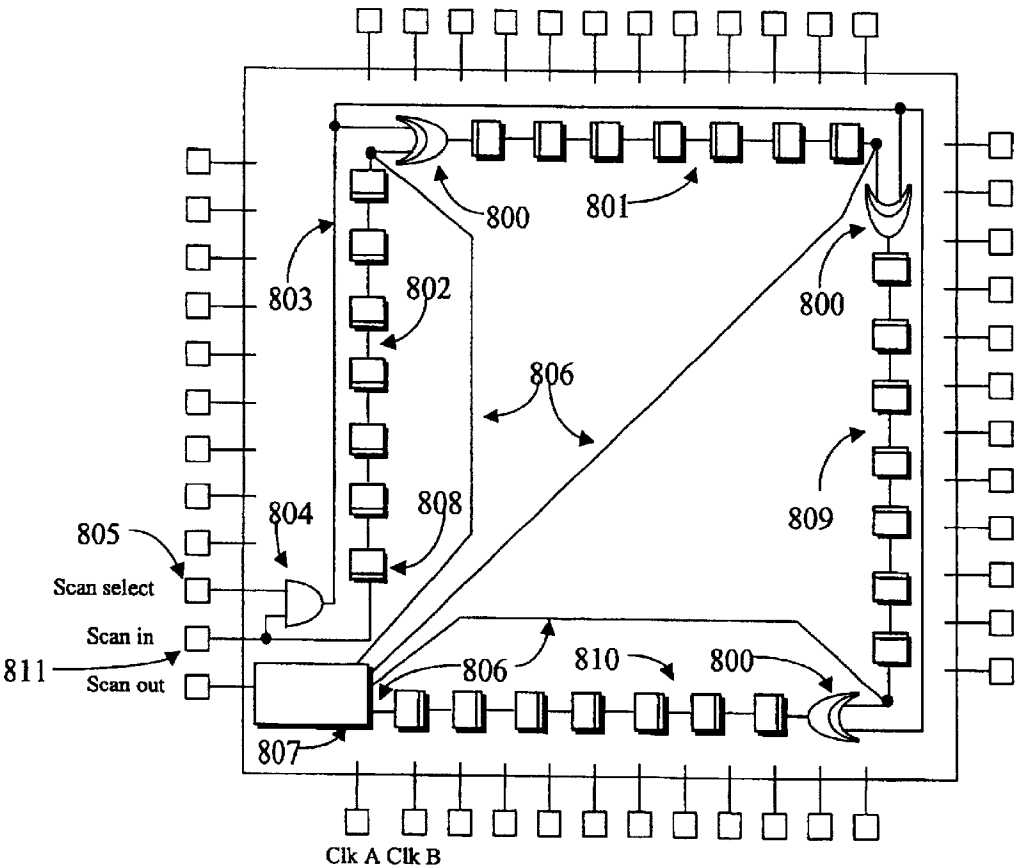
FIG. 8 is another embodiment with multiple sub-strings, which have selective combinatorial parallel input of scan in data for the test circuitry of FIG. 6.

In yet another embodiment, illustrated by FIG. 8, the scan string can be modified into any number of N sub strings by inserting N−1 2-input Exclusive Or gates 800 between successive sub-strings 801,802,809, and 810. A Select Input signal on line 803 is formed by the output of AND gate 804. It can be used to select either the output of the previous stage of the scan string or the Exclusive Ored combination of the signal on the Scan In terminal 811 with the output from the previous stage of the scan string so it may be applied as the serial input the next stage of the scan string, as shown in FIG. 8. Typically, the end of each sub-string may be selected as a tap point by lines 806, which connect to the check-sum, or signature register 807 as seen in FIG. 8. In general any number of additional taps may be added. When the Scan Select line 805 is low, the scan-in values are only inserted into the first register 808 of the scan string. In this mode the scan string functions in the same manner as the scan string shown in FIG. 6. When the Scan Select line 805 is high, the values from the Scan In terminal 811 are inserted in the first scan sub-string 802 as well as passing through the Exclusive Or gates 800 to enter into all the other sub-strings 801. The effect of this embodiment can be seen in the following example, where during each shift cycle a new value (denoted by "*") is applied at the Scan In terminal 811 and the entire contents of the scan register is shifted to the right by one bit position. New values are indicated: "x" in the implies the complement of the Scan In terminal's 811 value created by the Exclusive Or gate 800 which received a value of "1" from the previous scan string. Similarly, "*" implies an input value or an input value exclusive or with a previous result bit of "0":

**0 ****0 ****1 *1****0 required input vector 0110110 0011000 0101011 0010001 initial results vector

*011011 *001100 *010101 x00000 after first shift with terminal 805 set to "1"

**01101 x*00110 01010 xx00100 after second shift with terminal 805** set to "1"

***0110 xx*0011 ***0101 *xx0010 after third shift with terminal 805 set to "1"

****011 * xx*001 x***010 x*xx001 after fourth shift with terminal 805 set to "1"

*****01 x*xx*00 xx***01 *x*xx00 after fifth shift with terminal 805 set to "1"

EXAMPLE 4

As the Example 4 above shows, with the Scan Select terminal's signal in its asserted state, new values are put into bits 1, 8, 15, and 22, on each shift of the scan string. Since the "care-input" values are dependent upon existing values in the scan string, these cannot be set independently of each other. Therefore, additional analysis must be performed to determine the correct number of shifts and the Scan In values at each shift cycle. It is seen from Example 4 that the setting the "care-input" values is dependent upon the "*" and "x" values which are created as shifting is performed. As seen in Example 4, the initial results vector can not be used as the next test vector since "care-input" bit position 5 is set to "1" while a value of "0" is required. Similarly, the scan vector after the first shift has a conflict in the $23^{rd}$ "care-input" position. The first scan vector where there are no direct conflicts with any of the "care-input" values is after the $5^{th}$ shift cycle. At that point the "care-input" at the $5^{th}$ position is determined by the Scan In value that was applied at the first shift cycle and the "care-input" at the $23^{rd}$ position is determined by the complement of Scan In value that was applied at the fourth shift cycle. All other "care-input" values (i.e., at positions 14, 21 and 28 are determined by values that were present in the original results vector. Thus, the desired test pattern can be derived from the initial results vector by performing 5 shifts and applying Scan In value of "0" at the first and fourth shift cycles. It should be noted that, for the above Example, Scan In values at the second, third or fifth cycles do not matter for setting the "care-input" values for the next test vector and can be set to any arbitrarily selected values. The final test vector for this example is shown below:

**0 ****0 ****1 *1****0 required input vector 0110110 0011000 0101011 0010001 initial results vector

*0001 x0xx000 x1001 *1*x000 test vector obtained after five shifts

EXAMPLE 5

In another Example below, the bit positions of the required input vector requires additional analysis as described below: (Scan Select terminal 805 is set to "1")

0 **** 0 **1 1****** required input vector 0110110 0011000 0101011 0010001 initial results vector

*011011 *001100 *010101 x001000 results vector after first shift

**01101 x*00110 **01010 xx00100 results vector after second shift

***0110 xx*0011 ***0101 *xx0010 results vector after third shift

****011 *xx*001 x***010 x*xx001 results vector after fourth shift

*****01 x*xx*00 xx***01 *x*xx00 results vector after fifth shift

******0 xx*xx*0 *xx***0 x*x*xx0 results vector after sixth shift

EXAMPLE 6

In this case, the first time when there are no direct conflicts with any of the "care-input" values in positions 1, 12, 19, and 22 occurs after the 3$^{rd}$ shift cycle. Now, it is observed that "care-input" values at bit positions "1" and 22 are dependent on the Scan In value applied on the third shift cycle. Furthermore, the Scan In value is required to be set to "0" to satisfy the "care-input" value at bit position "1" while the same Scan In value needs to be set to "1" to satisfy the "care-input" value at bit position 22. The resulting conflict indicates that test results after the third shift cycle cannot be used to set up the next test pattern. It is also seen that the direct conflict on "care-input" value at bit position 19 indicates the result vector after the fourth shift is unusable as well. Furthermore, the results vector after the fifth shift cycle runs into two conflicts: bits 1 and 22 required the 5$^{th}$ Scan In value to be to opposite values and bits 12 and 19 require the Scan In for the 1$^{st}$ shift cycle to be different. Since neither requirement can be met, the results vector after five shift cycles is also rejected. Finally, with one additional shift, bit 12 is x and bit 19 is so if that shift value were "1", it would satisfy both required inputs. Similarly bit 1 is * while bit 22 is x so a shift value of "0" satisfies both required inputs. Therefore, this is a good pattern which is achieved by setting the second Scan In value to "1" and the sixth Scan In value to 0, while all other Scan In values may be set to arbitrarily selected values. The resulting test vector is shown below:

| | | | | |
|---|---|---|---|---|
| 0****** | ****0** | ****1** | 1****** | required input vector |
| 0110110 | 0011000 | 0101011 | 0010001 | initial results vector |
| 0***1*0 | 1x*x0*0 | 0xx*1*0 | 1*x*0x0 | test vector obtained after six shifts |

EXAMPLE 7

Test Generation Method

If the required input vector cannot be obtained after shifting through the entire first sub-string, the next shift into every other sub-string is dependent on values resulting from the Exclusive Or operation of two separate scan-in values. In order to properly evaluate such a condition, an extended algebra must be used, as described below:

TABLE 1

| xor | 0 | 1 | * | x | a | $\underline{a}$ | b | $\underline{b}$ | c | $\underline{c}$ | . | . |
|---|---|---|---|---|---|---|---|---|---|---|---|---|
| 0 | 0 | 1 | * | x | a | $\underline{a}$ | b | $\underline{b}$ | c | $\underline{c}$ | . | . |
| 1 | 1 | 0 | x | * | $\underline{a}$ | a | $\underline{b}$ | b | $\underline{c}$ | c | . | . |
| * | * | x | a | $\underline{a}$ | b | $\underline{b}$ | c | $\underline{c}$ | . | . | | |
| x | x | * | $\underline{a}$ | a | $\underline{b}$ | b | $\underline{c}$ | c | . | . | | |
| a | a | $\underline{a}$ | b | $\underline{b}$ | c | $\underline{c}$ | . | . | | | | |
| $\underline{a}$ | $\underline{a}$ | a | $\underline{b}$ | b | $\underline{c}$ | c | . | . | | | | |
| b | b | $\underline{b}$ | c | $\underline{c}$ | . | . | | | | | | |
| $\underline{b}$ | $\underline{b}$ | b | $\underline{c}$ | c | . | . | | | | | | |
| c | c | $\underline{c}$ | . | . | | | | | | | | |

TABLE 1-continued

| xor | 0 | 1 | * | x | a | $\underline{a}$ | b | $\underline{b}$ | c | $\underline{c}$ | . | . |
|---|---|---|---|---|---|---|---|---|---|---|---|---|
| $\underline{c}$ | $\underline{c}$ | c | . | . | | | | | | | | |
| . | . | . | | | | | | | | | | |
| . | . | . | | | | | | | | | | |

The Table 1 above is a truth table for an exclusive or operation on an algebraic set consisting of {0, *, a, b, and c} and their compliments {1, x, a, b, and c}, where:

0 and 1 signify Boolean logic values "0" and "1",

"*" and "x" signify a single input and it's compliment,

"a" and "$\underline{a}$" signify an exclusive or of two inputs and their compliment, "b" and "$\underline{b}$" signify and exclusive or of three inputs and their compliment, and "c" and "$\underline{c}$" signify an exclusive or of four inputs and their compliment.

The truth Table 1 is applicable for 4 sub-strings 801,802, 809, and 810 as shown in FIG. 8. It can be extended to account for additional sub-strings that may exist in the design, using additional elements d, e, etc., as necessary for the number of sub-strings. In the above Example 7 if shifting were continued further, the values would appear as shown below:

| | | | | |
|---|---|---|---|---|
| 0110110 | 0011000 | 0101011 | 0010001 | initial results vector |
| ******0 | xx*xx*0 | *xx***0 | x*x*xx0 | after 6 shifts |
| ******* | aa*xx*x | $\underline{a}$a**xx* | aa*x*x* | after 9 shifts |
| ******* | aaaaaaa | $\underline{b}$baa$\underline{a}\underline{a}$a | $\underline{b}\underline{b}$aaa$\underline{a}\underline{a}$ | after 16 shifts |
| ******* | aaaaaaa | bbbbbbb | $\underline{c}$c$\underline{b}$b$\underline{b}\underline{b}$b | after 23 shifts |
| ******* | aaaaaaa | bbbbbbb | ccccccc | after 28 shifts |

EXAMPLE 8

Shifting through the complete scan chain all 28 bit positions can be uniquely identified because the a, b, and c's are a function of 2, 3 and 4 inputs, so every bit position can be uniquely set. Hence the following generalized approach can be taken to determine the serial Scan-In vector to be applied to the sub-strings:

Let S1, S2, S3, . . . Sn be n sub-strings of equal length (assume k-bits in each sub-string) and let D denote a k-bit Scan In vector. Now, let $D_j$ denote the j-th, k-bit scan in vector, and $Si_j$ denote the values of the i-th sub-string after shifting $D_1$, $D_2$, . . . $D_j$ into the scan string. Thus, $S_n$ is the final (i.e., the desired) k values in sub-string Si.

Now, using the symbol "|" to denote the Boolean Exclusive Or operation, then, $S\mathbf{1}_n=D_n$ $S\mathbf{2}_n=S\mathbf{1}_{n-1}|D_n=D_{n-1}|D_n$ $S\mathbf{3}_n=S\mathbf{2}_{n-1}|D_n=D_{n-2}|D_{n-1}|D_n$

. . .

etc.

Solving these equations for $D_r$, (r=1 to n) yields, $D_n=S\mathbf{1}_n$ $D_{n-1}=S\mathbf{2}_n|D_n$ $D_{n-2}=S\mathbf{3}_n|D_{n-1}|D_n$ $D_{n-3}=S\mathbf{4}_n|D_{n-2}|D_{n-1}|D_n$

. . .

etc.

For example, if there are four, 3-bit substrings and the desired scan-string is given by 010 101 110 000

Then $S1_4$=010, $S2_4$=101, $S3_4$=110, $S4_4$=000

This leads to, $D_4=S1_4=010$ $D_3=S2_4|D_4=101|010=111$ $D_2=S3_4|D_3|D_4=110|111|010=011$ $D_1=S4_4|D_2|D_3|D_4=000|011|111|010=110$

EXAMPLE 9

In another embodiment of the invention the Scan select function for the scan test circuitry in FIG. 8 may be eliminated, as shown in FIG. 11.

Figure 20:
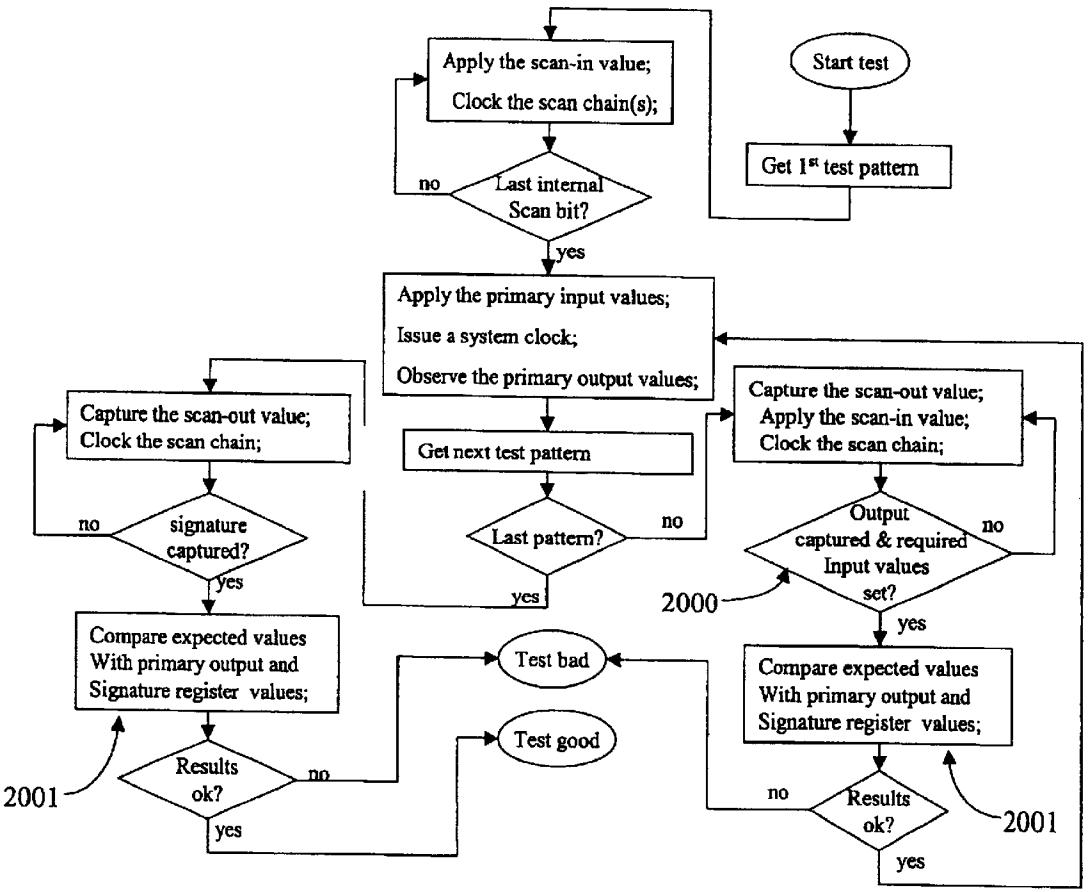
FIG. 20 is a flowchart of a test procedure according to one embodiment of the present invention.

A general algorithm is similar to the flowchart shown in FIG. 20 with an added procedure to determine "if required input values are set", decision step 2000. This "required input values are set" algorithm, as shown in FIG. 21, utilizes a function F with the following truth table:

TABLE 2

| Result value | F | 0 | 1 | * | x | a | a | b | b | v | c | . | . |
|---|---|---|---|---|---|---|---|---|---|---|---|---|---|
| Input value | 0 | 0 | 1 | 0 | 1 | * | x | a | a | b | b | c | 2 |
| Input value | 1 | 0 | 1 | 1 | 0 | x | * | a | a | b | b | c | c |

Figure 21:
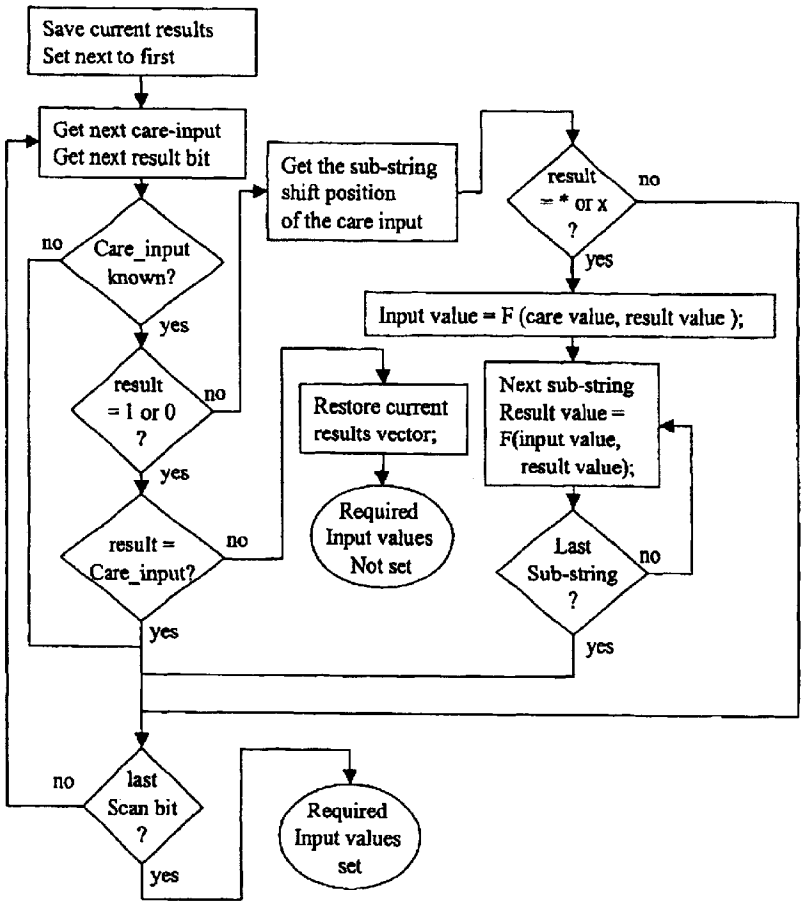
FIG. 21 is a flowchart of sub-steps for step 2000 in the test procedure of FIG. 20.

The algorithm, as shown in FIG. 21, goes through all the required inputs one at a time in order of the fewest unknown inputs first, and successively replaces unknown (i.e., values of {*, x, a a, b, b, c, c, . . . }) with known values (i.e., values of {0, and 1} the results vector across all the sub-strings. Since the algorithm starts with the lowest bit positions, it sets the result values with the fewest unknown inputs and then reduces the values that are functions of multiple inputs (a,b,c etc) down toward x or *, by the application of function F to the values in the scan-string. Incompatibilities can only occur when the number of required values exceed the number of scan-in values used to create the values. If the required values are incompatible, subsequent required value comparisons fail because subsequent results which have been set by the F function would not match the required values. In this way the algorithm above contemplates shifting the scan in values past the first sub-string.

In yet another embodiment of the structure shown in FIG. 8, the Scan Select line 805 may be turned on and off to selectively transfer the Scan In line 811 values to the Exclusive Ors 800, gating them into the successive substrings 801 on a bit-by-bit basis as needed. Consider the following Example:

| | | | | |
|---|---|---|---|---|
| 1****** | ****1** | ****0** | 0****** | required input vector |
| 1001001 | 1100111 | 1010100 | 1101110 | initial results vector |
| *100100 | x110011 | x101010 | *110111 | 1st shift with Terminal 805 set to "1" |
| **10010 | *x11001 | xx10101 | **11011 | 2nd shift with terminal 805 set to "1" |
| ***1001 | **x1100 | xxx1010 | x**1101 | 3rd shift with Terminal 805 set to "1" |
| ****100 | x**x110 | *xxx101 | *x**110 | 4th shift with Terminal 805 set to "1" |
| *****10 | *x**x11 | **xxx10 | x*x**11 | 5th shift with Terminal 805 set to "1" |
| ******1 | **x**x1 | 1**xxx1 | *x*x**1 | 6th shift with Terminal 805 set to "1" |

EXAMPLE 10

In this case the required "care input" values are not set after the first six shifts because Bit "1" and 22 are incompatible (required to be different but both are designated as "*").

However, using the same required input vector and the same initial results vector but allowing the Scan Select line 805 to be selectively asserted, a working solution can be found as:

| | | | | |
|---|---|---|---|---|
| 1****** | ****1** | ****0** | 0****** | required input vector |
| 1001001 | 1100111 | 1010100 | 1101110 | initial results vector |
| *100100 | x110011 | x101010 | *110111 | 1st shift with Terminal 805 set to "1" |
| **10010 | *x11001 | xx10101 | **11011 | 2nd shift with Terminal 805 set to "1" |
| ***1001 | **x1100 | xxx1010 | x**1101 | 3rd shift with Terminal 805 set to "1" |
| ****100 | x**x110 | *xxx101 | *x**110 | 4th shift with Terminal 805 set to "1" |
| *****10 | *x**x11 | **xxx10 | x*x**11 | 5th shift with Terminal 805 set to "1" |
| ******1 | 0*x**x1 | 1**xxx1 | 0x*x**1 | 6th shift with Terminal 805 set to "0" |

EXAMPLE 11

In yet another embodiment the sub-strings need not be the same length. For example, the sub-string lengths may be defined to minimize the number of shifts required to set all the required "care-input" values. Typically, this is achieved by evenly spacing the Exclusive Or gates 800, except when there are many potential "care-input" conflicts which require additional shift cycles to establish the desired input vector. There are many potential procedures to find such optimized sub-string lengths. One such procedure is described below:

1) generate the test vectors as described above, with only the "care-input" positions defined as "1" or "0".
2) Choose the number of sub-strings N such that N is a power of 2, which means there are N−1 Exclusive Or gates to be inserted, beginning with the entire string as the sub-string to work on.
3) Successively bisect first the original scan string, and then each of its' sub-strings, in order of the largest sub-string first, until all exclusive or gates are inserted. To choose the placement of the Exclusive Or gates do:

```
a) For each pattern:
    Set the values of an array the size of the sub-string to zero;
    For each "care input" location in the sub-string;
        For every other "care input" location in the sub-string;
            Increment the array at the location of the difference
            between the "care input" shift locations;
        End;
    End;
End;
```

b) Now add K to each element in the array, where K is equal to the number of patterns times the absolute value of the difference between half length of the sub-string and the location of the array entry:

c) Choose the location with the lowest value and bisect the sub-string at that point:

Procedure 1

The K=#patterns*|sub-string length/2−sub-string locations|. This is the probable cost of shifting all the patterns extra locations because of the uneven sub-strings, and the original sum was the probable cost of additional shifting due to conflict in the input vectors. Clearly the best solution is to break the string into N sub-strings of the same length, unless there are significant conflicts with that solution. By choosing the lowest number, the minimum probable increase in shift count over the whole test pattern for that exclusive or placement is achieved.

It should be noted here, that this procedure does not take into consideration the conflicts between multiple independent sub-strings below the first bisection. As such, it is a near optimal algorithm. Other more exhaustive algorithms may be employed to obtain a more optimal solution.

Similarly, in one embodiment of the present invention, multiple check-sum, or signature register taps may be placed on each sub-string. The number of taps should be selected with an objective that the expected number of shifts to capture the "care-output" output values be less than the expected number of shifts to set the "care-input" values required for the next input vector. This way, by the time all of the "care-input" values have been set in their respective scan bit positions, all of the "care-output" values will have been captured also. Typically this requires multiple taps on each sub-string, as evenly spaced as possible, but the optimal spacing is a function of the required output values to be captured and, as a result, may be uneven. Such a structure can be seen in FIG. 10. In yet another embodiment of the present invention, the tap positions may be selected so that they are "close to being evenly spaced" but not exactly evenly spaced, in order to help reduce the probability of signature "aliasing" inside the checksum or signature register.

Figure 9:
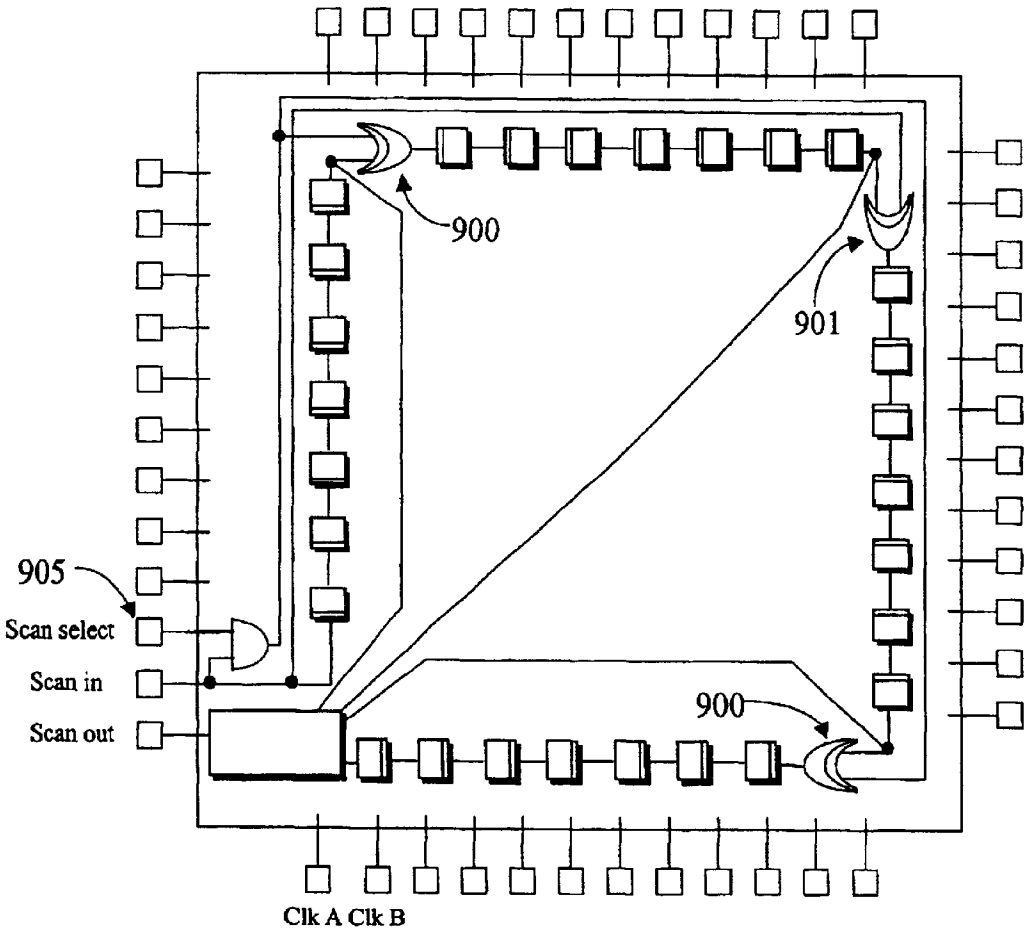
FIG. 9 is another embodiment of FIG. 8 test circuitry with partial scan select function.

In yet another embodiment the Scan Select 805 signal as shown in FIG. 8, is not coupled to all of the Exclusive-Or gates 800. In this case, as shown in FIG. 9, the remainder of the Exclusive-Or gates 901 are connected directly to the Scan Input terminal so that the Scan Select 905 line is used to reduce the effective number of scan sub-strings that require many "care-input" positions that are required to be set.

Given N-many scan sub-strings, each with m-many positions and a total of r-many "care-input" values that need to be established along the entire scan chain, the probability analysis presented below shows that the expected number of sub-strings shifts may be approximately a low of 2–4 or may approach N, where $m \sim r/4$ and $r \ll mN$.

Figure 10:
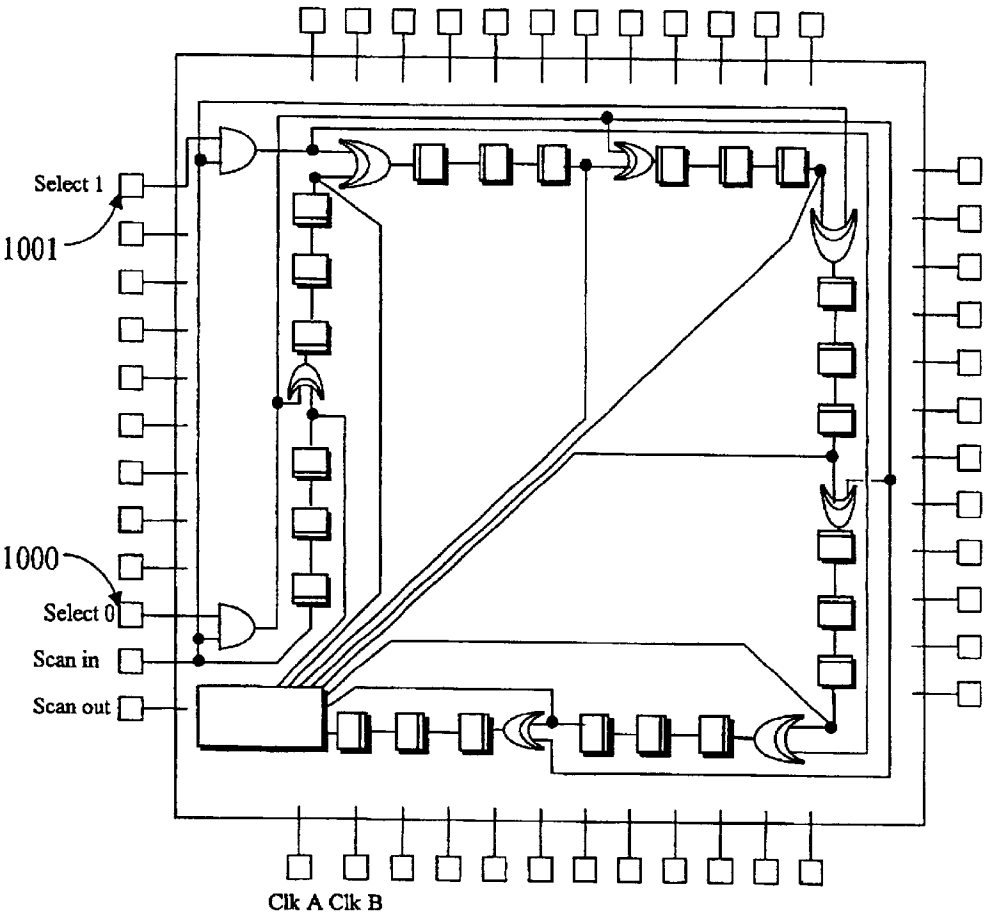
FIG. 10 is another embodiment of FIG. 9 test circuitry with additional taps, additional sub-strings and multiple scan select functions.

Accordingly, in yet another embodiment of the present invention, multiple Scan Select terminals 1000,1001 may be used, such that the number of sub-strings is close to the ideal number of sub-strings for the number of required values to be set, as illustrated in FIG. 10.

Tap Selection and Care Output Capture

Figure 11A:
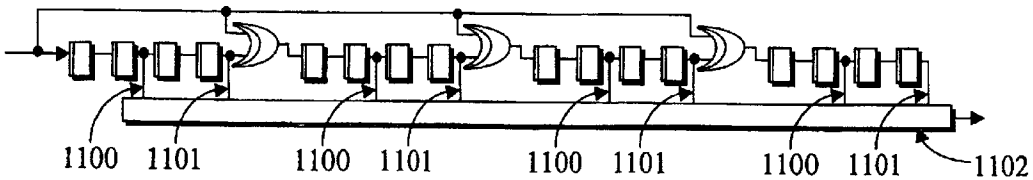
FIG. 11a is another embodiment of FIG. 9 test circuitry with no scan selects.

In yet another embodiment, as shown in FIG. 11a, there is no scan select, and there are at least two taps connected to a check-sum or signature register 1102, preferably close to evenly spaced at the mid point 1100 and end 1101 of each sub-string.

Figure 11B:
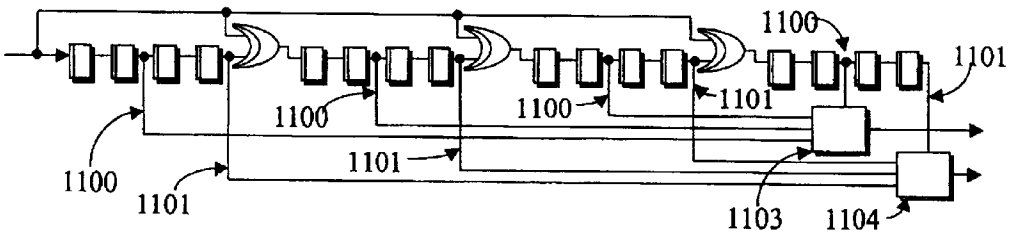
FIG. 11b is another embodiment of FIG. 9 test circuitry with multiple check-sums or signature registers.

Such a configuration raises the possibility of aliasing between the expected data shifted into the mid-point 1100 and end-point taps 1101 of each sub sub-string. In other words, two care outputs could fail due to the same fault, and their spacing is such that they are both captured on two separate tap points at the same time, in which case they are canceled in the check-sum or signature register. To avoid this, the taps should be slightly irregularly spaced so that failure to capture a pair of care outputs on two taps due to aliasing, will not result in aliasing at the next pair of taps. Also, in yet another embodiment, as shown in FIG. 11b, multiple copies of the check-sum of signature register 1103, 1104 may be created, each with one input from each sub-string such that the first check-sum or signature register 1103 is connected to the first mid-point taps 1100 from each sub-string, and the second check-sum or signature register 1104 is connected to the second end taps 1101 from each sub-string. Of course this can continue if more than two taps exist on one or more sub-strings. This also minimizes the possibility of covering failing expected data by minimizing the likelihood of capturing the faulty expected data more than once. In a more general fashion, different configurations of connections to multiple check-sums and signature registers may be used to minimize the covering faulty expected data through multiple captures of the same faulty data.

Figure 11C:
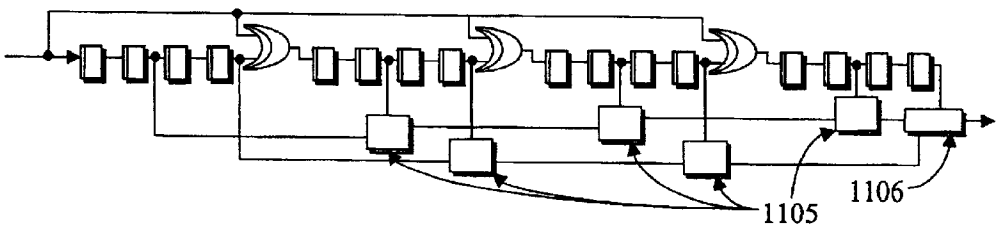
FIG. 11c is another embodiment of FIG. 9 test circuitry with check-sums feeding a signature register.

A preferred embodiment shown in FIG. 11c, has multiple check-sums 1105 serially connected to each other and a signature register 1106, minimizing the wiring and the shifting to capture the "care outputs".

1. Sub-string Creation and Preferred Test Generation Methods

While many different specific optimizations, such as those suggested above, and others, the general method for creation of the sub-strings, taps and test pattern optimizations should be as follows:

1) Choose initial tests to fully scan in (typically less than 20, but at least 1)
2) Fill the initial tests with random numbers, fault simulate the vectors, and keep the captured fault lists.
3) Generate the rest of the vectors using existing test generation techniques and keep the resulting caught fault lists for each test.
4) Choose the number of sub-strings to create, and either evenly divide the string into sub-strings by inserting exclusive or gates or choose some other technique to define the exclusive or gates placements in the scan string.
5) Optionally optimize the remaining vectors based on minimizing the total input shifting requirements
6) Place at least one tap at the end of each sub-string and through some optimization technique optionally place additional tap points as needed.
7) Optimize the vectors based on minimizing the total shift requirements for both inputs and capturing outputs.
8) Convert the scan string into the specified sub-strings and tap points in a manner similar to existing test logic insertion techniques
9) Generate the actual test vectors by the techniques defined above.
10) Convert the test vectors into tester patterns using conventional techniques used in the industry.

Procedure 2

Figure 22:
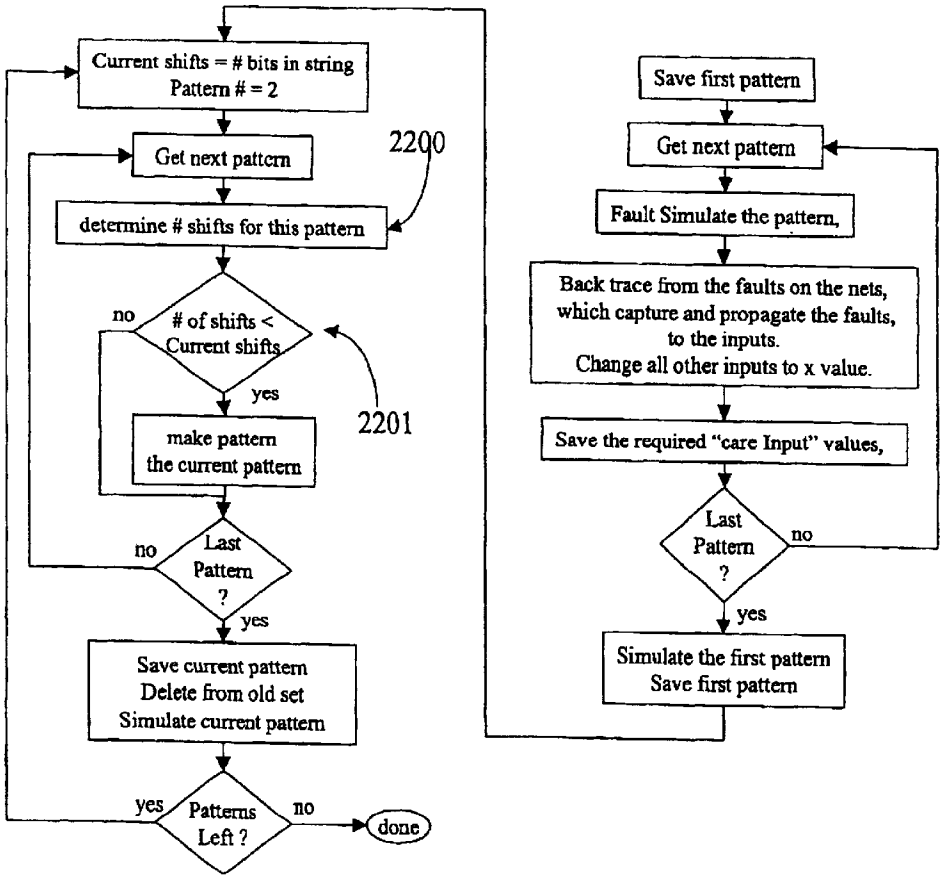
FIG. 22 is a flowchart of sub-steps for step 7 in procedure 2.

Given the existing test set of independent tests from steps 2 and 3 in procedure 2, the flowchart in FIG. 22 is a detailed technique for step 7, using variable scan testing, to reorder the existing tests to minimize the overall test time that is better suited for implementing in software. The determining the number of shifts 2200 requires shifting each pattern, and resolving the simultaneous equations on each shift to determine if a proper vector can be established. The next step 2201 successively chooses the pattern with the lowest number of required shifts.

For this procedure we are assuming M sub-strings of N shift bits was created in step 4, and that there are two or more taps to two or more check-sums or signature registers from each of the sub-strings created in step 6 of procedure 2.

The flowchart in FIG. 22 also assumes the initial pattern has no don't care values (in other words all values are required "care inputs In yet another embodiment, the flowchart in FIG. 22 can be improved by fault simulating each pattern, checking the faults that are caught and eliminating patterns whose faults have already been caught prior to going on to the next pattern.

And in yet another embodiment, the flowchart in FIG. 22 can be further improved by ignoring the "care output" capturing requirements for a pattern, letting the faults cycle through another simulation cycle. If they are not caught on the next cycle, go back and shift sufficiently to catch them at the tap points.

In yet another embodiment, the calculation of the number of shifts (step 2200) in FIG. 22, can be structured in a form that is more conducive to software programming than the flowcharts in FIGS. 20 and 21 as follows:

Before shifting the required values must be equal to the values from the previous pattern.

If the required values are r0-rf, and the previously existing values are s0-sf, a scan string consisting of 4 sub-strings of 4 bits each would good if the conditions in Table 8 are true:

TABLE 8

| | | | |
|---|---|---|---|
| r0 = s0 | r1 = s1 | r2 = s2 | r3 = s3 |
| r4 = s4 | r5 = s5 | r6 = s6 | r7 = s7 |
| r8 = s8 | r9 = s9 | ra = sa | rb = sb |
| rc = sc | rd = sd | re = se | rf = sf |

Where each term, which has no required value, is "0". This is simply:

$$\text{not_valid}=(\Sigma\ r_i|s_i \text{ or "0" if } r_i \text{ is "*"}) \quad [1]$$

Where the values are valid if not_valid=0.

Now as the new values shift into the first sub-string they are also Exclusive-Ored with the shifted bits from the previous pattern in all the subsequent sub-strings, so that given x0-x3 are the new shifted values, the values would be as shown in Table 9 below:

TABLE 9

| x0 | x1 | x2 | x3 |
|---|---|---|---|
| x0is0 | x1is1 | x2is2 | x3is3 |
| x0is4 | x1is5 | x2is6 | x3is7 |
| x0is8 | x1is9 | x2isa | x3isb |

Where "|" is an Exclusive Or operation. Now x0 through x3 can be selected such that the Exclusive-Or operation of the new x value with the existing previous scan value must be equal to the required value. In other words, the x values must be as defined in Table 10 below:

TABLE 10

| x0 = r0 | x1 = r1 | x2 = r2 | x3 = r3 |
|---|---|---|---|
| x0 = r4is0 | x1 = r5is1 | x2 = r6is2 | x3 = r7is3 |
| x0 = r8is4 | x1 = r9is5 | x2 = rais6 | x3 = rbis7 |
| x0 = rcis8 | x1 = rdis9 | x2 = reisa | x3 = rfisb |

But for all the required values in the first row, substitution of x0-x3 with r0-r3 can be made, so to determine if x0-x3 can be set to values to meet the test's required values, each column of expressions in Table 11 below must be true:

TABLE 11

| | | | |
|---|---|---|---|
| r4 = r0is0 | r5 = r1is1 | r6 = r2is2 | r7 = r3is3 |
| r8 = r0is4 | r9 = r1is5 | ra = r2is6 | rb = r3is7 |
| rc = r0is8 | rd = r1is9 | re = r2isa | rf = r3isb |

As we shift new values beyond the first sub-string into the second sub-string, the values are as shown in Table 12 below:

TABLE 12

| x0 | x1 | x2 | x3 |
|---|---|---|---|
| x4\|x0 | x5\|x1 | x6\|x2 | x7\|x3 |
| x4\|x0is0 | x5\|x1is1 | x6\|x2is2 | x7\|x3is3 |
| x4\|x0is4 | x5\|x1is5 | x6\|x2is6 | x7\|x3is7 |

Now x0-x3 can be set to r0-r3, and x4-x7 can be substituted with r4-r7 so the remaining requirements reduce to the expressions in Table 13 below:

TABLE 13

| | | | |
|---|---|---|---|
| r8 = r4is0 | r9 = r5is1 | ra = r6is2 | rb = r7is3 |
| rc = r4is4 | rd = r5is5 | re = r6is6 | rf = r7is7 |

And, similarly for shifting values into three sub-strings, the expressions in Table 14 must be met:

TABLE 14

| | | | |
|---|---|---|---|
| rc = r8is0 | rd = r9is1 | re = rais2 | rf = rbis3 |

This process continues in this fashion until all required values are met.

Figure 23:
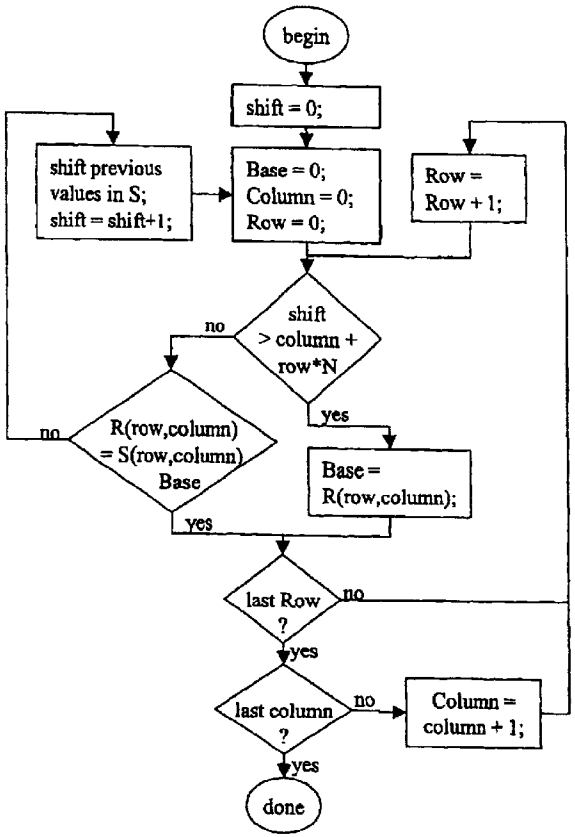
FIG. 23 is a flowchart of sub-sub-steps for sub-step 2200 in the FIG. 22 flowchart.

Now given S(*,*) are the previous pattern's output values and R(*,*) are the required "care-input" values, the flowchart in FIG. 23 will find the number of shifts to meet the required values, step 2200 in the flowchart in FIG. 22.

It should be noted that the procedure represented in FIG. 23 does not produce a pattern, it merely determines the minimum number of shifts of a pattern to meet the required values. The specific new values to shift in are a function of the actual required values, which can be calculated in a manner similar but extended from this procedure. Furthermore, the flowchart in FIG. 23 does not take into consideration the number of shifts necessary to capture the required outputs, which was shown in Example 1e. This is easily added by initially shifting until all the faults in the fault lists on the outputs of the previous pattern have been shifted into tap points, and then beginning with that shift number other than zero.

Figure 24:
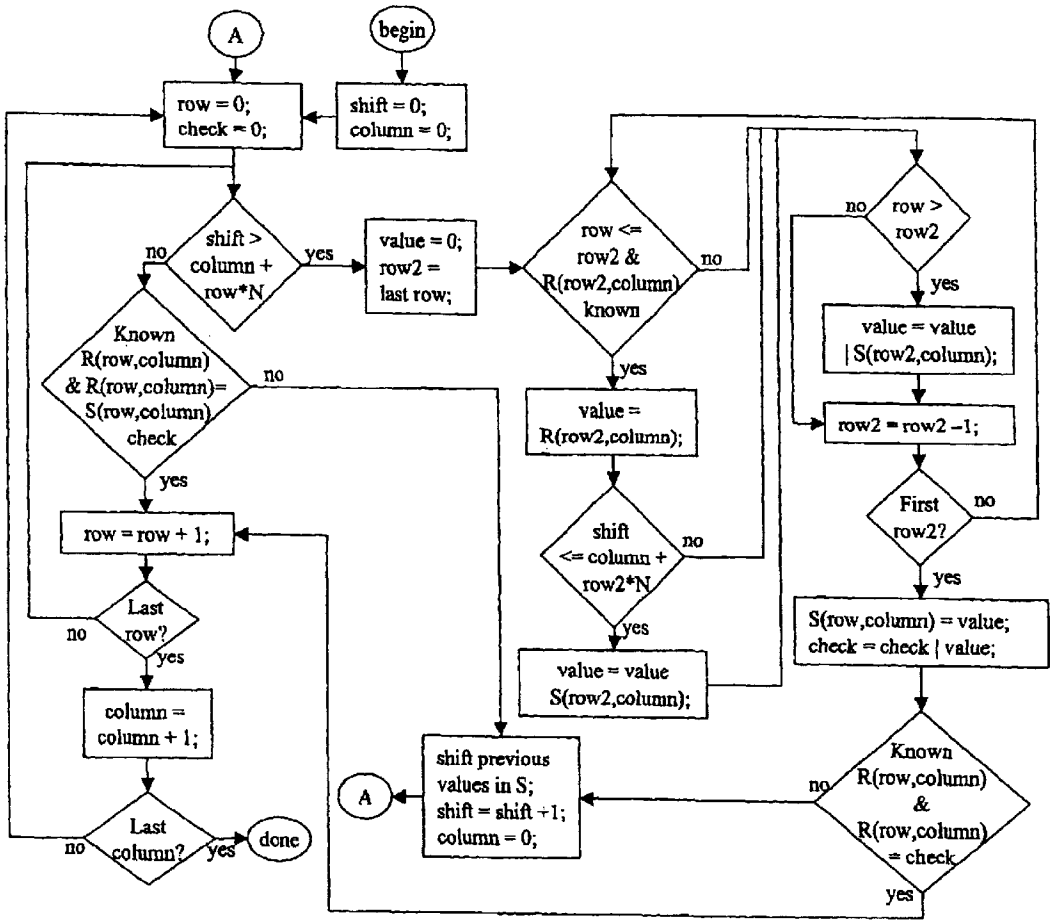
FIG. 24 is a flowchart of steps to create variable clocked test vectors.

The Flowchart in FIG. 24 is extended from the approach taken in FIG. 23 to produce the actual pattern. Again we start with the requirements in Table 8 and the operation in equation [1]. For each shift into the first sub-string, the shifted in "x" value must be determined by the first cell with a required bit in the column of the "x" value. The rest of the required bits in that column are checked against the assignment of the first value. For example the required "care inputs" were:

01 10 00 01

EXAMPLE 12

Then after shifting in 4 bits x0-x3 are assigned 0**1 and the values shifted in are:

TABLE 15

| x0 | x1 | x2 | x3 |
|---|---|---|---|
| x0is4 | x1is5 | x2is6 | x3is7 |
| x0is8 | x1is9 | x2isa | x3isb |
| x0isc | x1isd | x2ise | x3isf |

Which can be converted into the assignments shown in Table 16 below:

TABLE 16

| | | | |
|---|---|---|---|
| x0 = r0 | x1 = * | x2 = r6is6 | x3 = r3 |

The checking is then done by assigning the r values and verifying the following are true:

TABLE 17

| | | |
|---|---|---|
| | 1 = 1is6is6 | 0 = 1is7 |
| 0 = 0is8 | | 0 = 1isb |
| | 0 = 1is6ise | 0 = 1isf |

This process continues through the second row as follows: After shifting in 4 more bits, x4-x7 are assigned * *10 and the values shifted in are:

TABLE 18

| x0 | x1 | x2 | x3 |
|---|---|---|---|
| x4\|x0 | x5\|x1 | x6\|x2 | x7\|x3 |
| x4\|x0is8 | x5\|x1is9 | x6\|x2isa | x7\|x3isb |
| x4\|x0isc | x5\|x1isd | x6\|x2ise | x7\|x3isf |

Which can be converted into the assignments shown in Table 19 below:

TABLE 19

| | | | |
|---|---|---|---|
| x0 = r0 | x1 = * | x2 = xr(is6 | x3 = r3 |
| x4 = r8is8\|x0 | x5 = * | x6 = r6\|x2 | x7 = r7\|x3 |

Where the value "(|s6)" only applies if s6 still exists (i.e., less than 7 shifts occurred). The checking is then done by assigning the r values and verifying the following are true:

TABLE 20

| | | |
|---|---|---|
| 0 = 0is8\|0\|0\|s8 | | 0 = 0\|1\|1\|sb |
| | 0 = 1\|1\|se | 1 = 0\|1\|1\|sf |

This continues row by row until all created values have been verified good.

Considering the assignment of x2 occurs later than the first row because the first row does not contain a required value, code to assign the value to an x variable should begin from the highest row, reassigning it until no lower level required values exist. The flowchart to create the proper values is shown in FIG. 24.

In the flowchart in FIG. 24, the x values are calculated in the variable value and put back into S(*.*). The check variable is used to calculate the actual exclusive or values in the string to compare with the required "care input" values.

While the algorithm described in FIG. 24 produces correct results for designs with equal length sub-strings, if, as suggested in step 3) in procedure 1 or 4) of procedure 2 described above, some other technique is used, which results in sub-strings of unequal length the algorithm will not work. Under these conditions for each test do the following:

a) evaluate the variables in each of the "care input" locations and compare the resulting values to the corresponding "care input". If they all match skip to step i).
b) move all output values to the next higher location in the string, i.e. $S_i \rightarrow S_{i+1}$
c) insert a new variable xi in the first position of the output values and set it unknown
d) insert a new variable xj in the first position of each subsequent sub-string of the output values and set it to xi|existing contents
e) evaluate the variables in each of the "care input" locations and compare the resulting values to the corresponding "care input". If they all match skip to step i).
f) set an unknown variable in equation at a "care input" location with the least unknowns to a state necessary to match the "care input" value.
g) Repeat steps e), f) and g) until no variables are left to set
h) increment the shift count and repeat steps b) through g).
i) output the values of the xi variables, if they are unknown set them to 0

Procedure 3

Procedure 3 above correctly evaluates the equations created by the shift and exclusive or operations in the scan string, regardless of the size of each sub-string, but may require more computation than the algorithm described in FIG. 24, which can preferably be used for strings with equal length sub-strings.

Multiple Scan Strings

Figure 12:
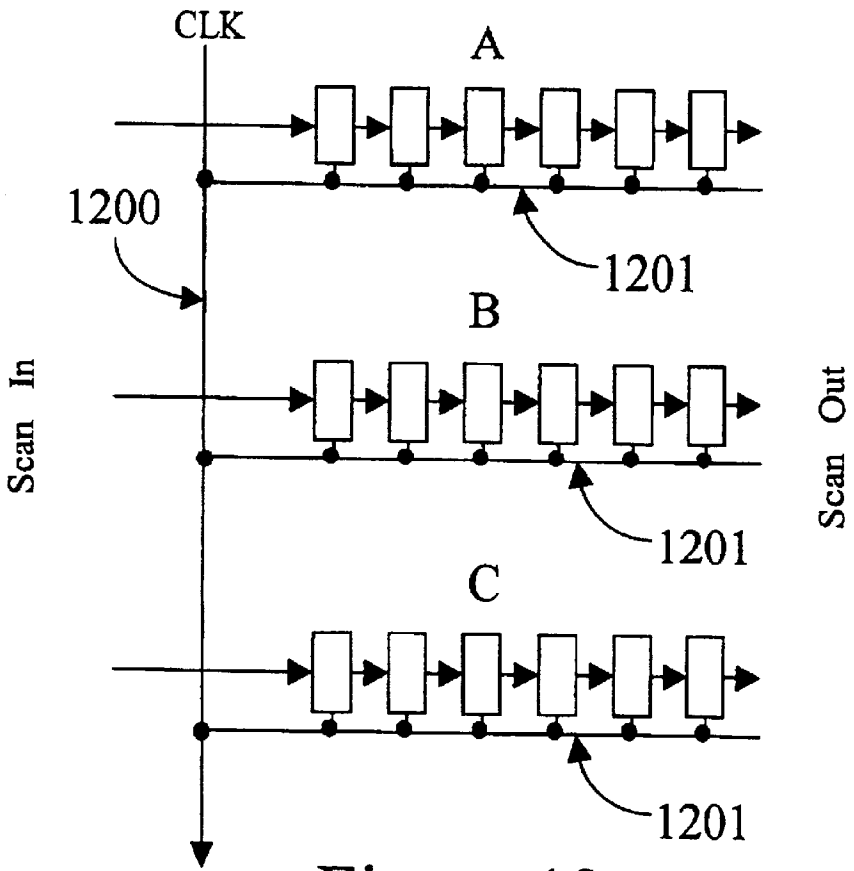
FIG. 12 illustrates test circuitry with multiple scan strings connected to a common clock signal, according to the present invention.
Figure 13:
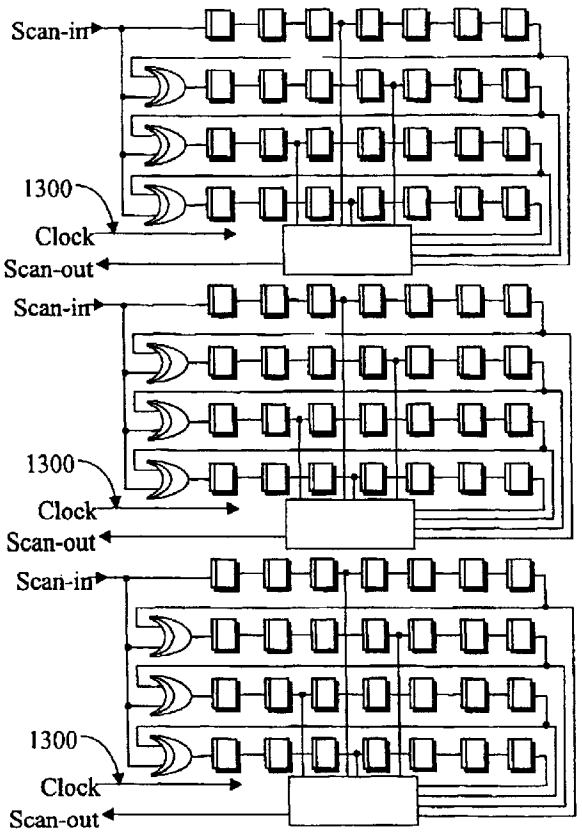
FIG. 13 illustrates test circuitry with multiple scan strings with sub-strings, according to the present invention.

A common technique in the industry to reduce the number of tester cycles needed to perform serial scan-in of the target device is to break the scan-strings into multiple scan-strings with separate scan-in and scan-outs as shown in FIG. 12. FIG. 12 shows a common clock signal line 1200, and all three scan strings 1201 are scanned in parallel. It is desirable to balance the parallel strings so they are of equal length. Scan In values for the shorter chains need to be padded with arbitrary values so that all strings finish scan-in simultaneously. A similar architecture can be used with the present invention as illustrated in FIG. 13. When multiple variable clocked strings exist within a design, it is advantageous to separate the scan clocking of the separate scan strings so they can be started and stopped individually. This is because the separate strings may require different numbers of shift cycles clocks in order to set up the next test pattern in them. Requiring all scan chains to start and stop shifting at the same time may increase the number of clock cycles needed to set up the test patterns simultaneously in all of the scan chains. This could be accomplished using separate clock lines 1300 as shown in FIG. 13, but this causes an increase in the number of clock pins needed.

Figure 14:
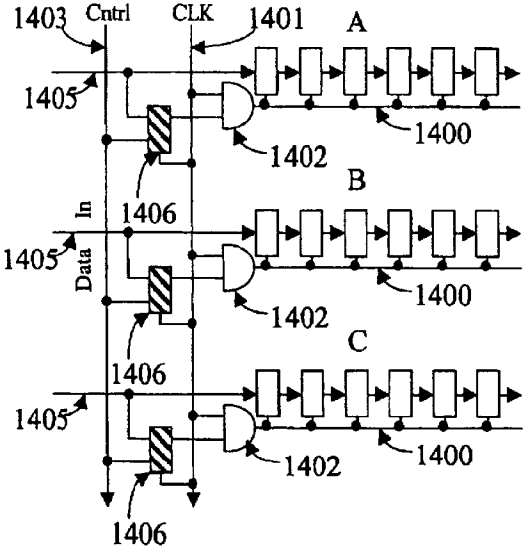
FIG. 14 illustrates test circuitry with of FIG. 12 with individual scan string clock enable logic, according to the present invention.

In a preferred embodiment of the present invention, illustrated in FIG. 14, individual scan string clock lines 1400 are created from a single clock line 1401 by enabling 1402 it with a combination of a single control line 1403, readily available in most scan test methods, and the scan-in data lines 1405. FIG. 14 shows the clock enable control logic 1406 for each scan string represented as a black box. FIG. 15 shows an example design for the clock enable logic 1406. This logic consists of two memory elements 1500, 1501, clocked by opposite phases of a clock signal on the clock line 1401 and feedback logic which takes the scan in data on line 1405 and the common control signal on line 1403 to create a clock enable output signal on line 1504. Other combinations of logic may be created to serve the same purpose.

The control signal on line 1403 can come from a primary pin, from a Tap controller, or other suitable control logic, which issues the control signal value prior to the beginning of each scan sequence, and maintains that value throughout the scan operations. The control signal is set to the opposite value at any other time, such as to capture the test results or during normal system operation. As such, the control signal is readily available in most systems that implement scan where a SCAN_ENABLE signal may be used to select either serial scan or normal capture operation of the system flip-flops.

The clock enable control circuit 1406 shown in detail in FIG. 15, uses preferably a rising-edge clocked flip-flop 1500 and preferably a negative-edge clock enabled latch 1501 that operate on the common clock signal on line 1401. After initialization with the control signal on line 1403 set to logic "0", the flip-flop 1500 is set to "1" and the latch 1501 is set to "1". This allows the AND gates 1402 in FIG. 14 to pass clock pulses from lines 1401 through to scan clock lines 1400 and reach the scan-chains A, B and C. On the first rising-edge of clock pulse on line 1401, after the control signal on line 1403 becomes set to "1", the Scan In signal on line 1405, which is gated by the positive polarity output from the flip-flop 1500 and the control signal line 1403, is loaded into flip-flop 1500. On the following falling-edge of clock pulse on line 1401 the value in the flip-flop 1500 is inverted through NAND gate 1504 and is transferred into latch 1501. Since the latch's positive polarity output forms an enable signal on line 1503 that controls the AND gates 1402 to pass or block clocks pulses on lines 1400 to the scan-chains. The scan-chain clocks are turned on if the Scan In lines 1405 have values set to "0", and blocked otherwise. On the first clock cycle after enabling the control signal on line 1403, only the string(s) with the highest number of shift clocks required for setup of their test vectors shall have its (their) Scan In input set to "0", so that the scan strings have their clock(s) enabled on the next clock cycle. All the other Scan In inputs are set to "1", successively setting the Scan In inputs to "0" one cycle before their clocks need to be enabled. Once enabled, the clock(s) for the scan string(s) remain enabled even if the Scan In signal lines 1405 are set to "1", until the first rising-edge of a clock pulse on line 1401 after the control signal on line 1403 has become de-asserted (i.e., set to "0") again. In this manner, the Scan In signal on line 1403 for each scan-chain can be used to delay the starting of that chain's clocks by keeping the Scan In signal at logic "1". This allows scan-chains that require smaller number of shift cycles to set up their test vectors to remain unaffected while the global scan clock signal on line 1401 is active, allowing other scan chains to start their shift operations. For each scan-chain, its Scan In signal line 1405 should be set to "0" on the cycle before its scan operations are to be started.

Figure 16:
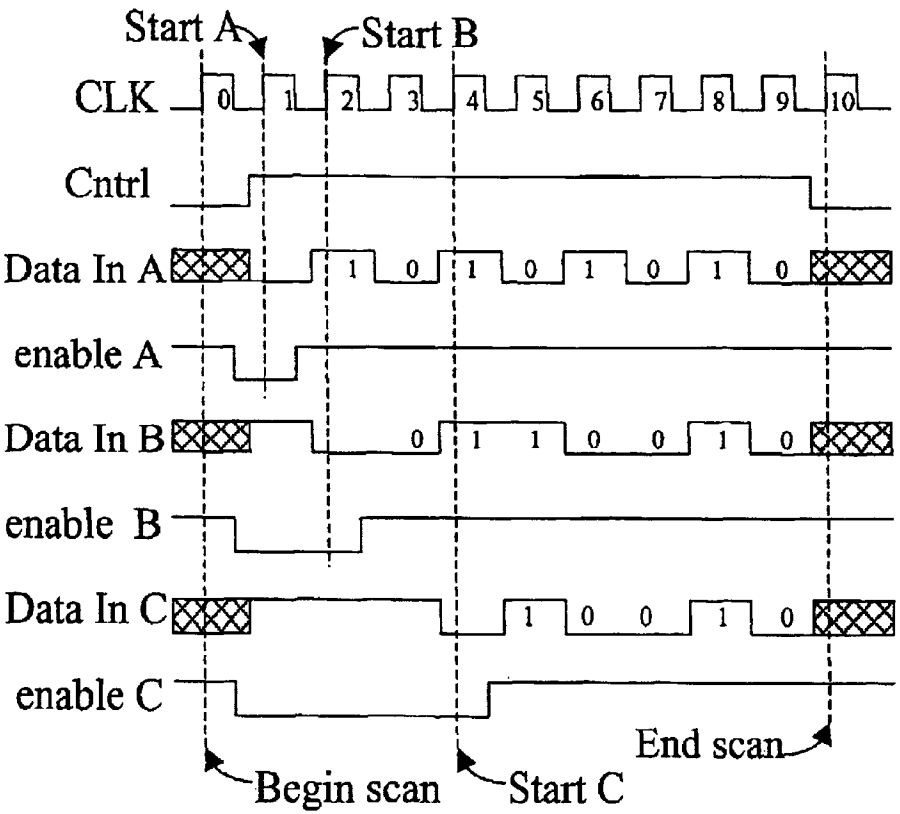
FIG. 16 is a waveform diagram to illustrate operation of the test circuitry of FIGS. 14 and 15.

FIG. 16 shows signal waveform diagrams of the operations for the exemplary scan strings of FIGS. 14 and 15. The waveform 1603 represents the clock signals on the clock lines 1401; the waveform 1605 represents the signals on the control signal line 1403; the waveform 1606–1608 represent the data signals on the Data In lines 1405, for the scan chains A, B and C respectively. Below each Data In waveform 1606–1608 is a corresponding waveform for the enable control signal on the line 1503 from the corresponding clock enable control logic 1406. In the first clock cycle, labeled 0, and starting at the dotted line 1600, the control signal 1605 transitions low and the Scan In values 1606–1608 are set to their last clocked in values. This resets the set-reset logic, of the clock enable control 1406, which turns off all the clock enable signals on the falling edge of the clock signal 1605. In the next clock cycle 1, the start of which is denoted by the dotted line 1601, the Scan In data waveform 1606 for string A goes low, which sets its clock enable for the next clock cycle. Thereafter the Scan In data 1606 for string A is 10101010. In clock cycle 1 Scan In data waveform 1607 for string B and Scan In data waveform 1608 for string C are set to "1", which insures that their clocks remain disabled. On clockcycle 2, the start of which is denoted by the dotted line 1602, the Scan In data waveform 1607 for string B goes low, enabling it's clock on the next cycle and thereafter scans in 0110010. Finally, on clock cycle 4, the start of which is denoted by the dotted line 1604, the Scan In data waveform 1608 for string C goes low, also enabling its clock and thereafter scans in the values 10010. After the front edge of the scan clock cycle 9, the start of which is denoted by the dotted line 1609, the control signal 1605 again goes low, after which all the Scan In values go to their test input state, to clock the scanned pattern on clock cycle 10, the start of which is denoted by the dotted line 1610. As many cycles of this non-scan state can occur as necessary before the next pattern begins. It should be noted that all signal waveforms 1605,1606,1607, and 1608 can transition anywhere within the clock cycle, but are shown in the second half of the clock cycle, which is typically where they would transition.

The described logic requires 1 additional clock cycle for the whole test set to prime the clock enable control logic 1406, and one additional clock cycle per test to enable the first scan string clock, but does not require separate scan clocks for the individual scan chains. It requires very little logic, it meets scan test design rules, and it is easily extended to as many strings as needed. A key is to enable the clock signals of each scan string separately and to successively enable, rather than successively disable the clock signals to get the desired bits scanned in. Furthermore, if the control logic 1406 is also scanned, it must be done on separate scan strings from the scan strings it controls.

Pseudo Random Patterns

Figure 17:
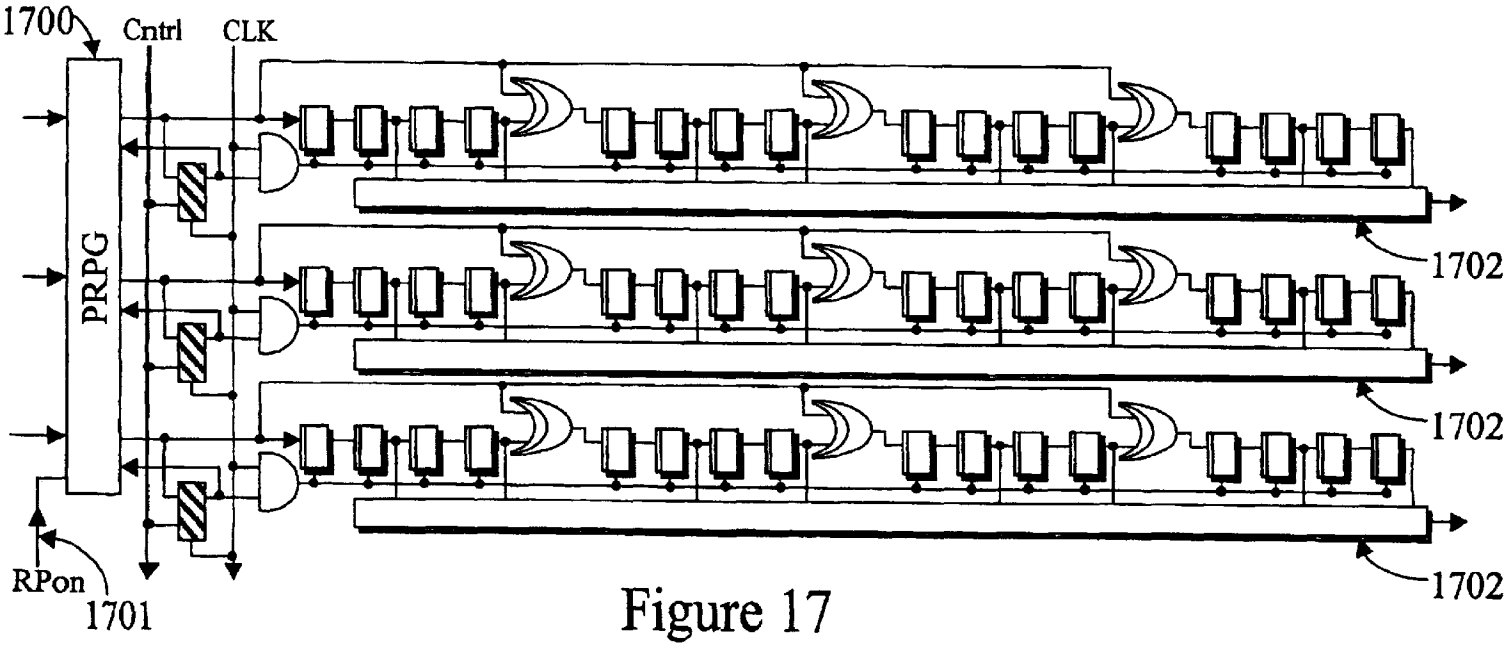
FIG. 17 illustrates test circuitry of FIGS. 13 and 14 with a pattern generator attached.
Figure 18:
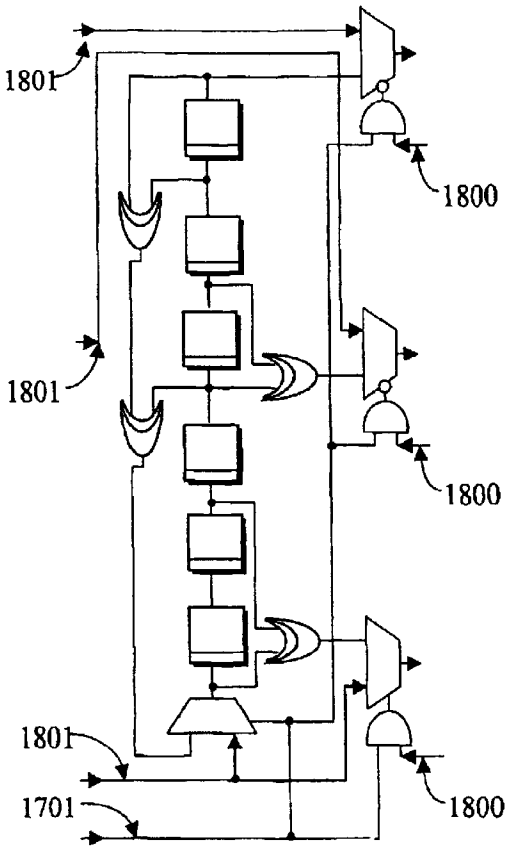
FIG. 18 is a block diagram of a Pseudo Random Pattern Generator.

In yet another embodiment, as shown in FIG. 17, a Pseudo Random Pattern Generator (PRPG) 1700 may be added in front of the multiple variable clocked scan strings to generate random patterns. While this does not reduce the test time, it can significantly reduce the volume of the test data required to test the integrated circuit. An example of a PRPG, controlled by an Rpon signal on line 1701 can be seen in more detail in FIG. 18. The unique feature of this PRPG is the use of the clock enable signals on lines 1800 to select between the scan data inputs on lines 1801 and the random patterns, if the Rpon signal on line 1701 is set high. When the Rpon signal on line 1701 is low, the scan data input lines 1801 are always selected. When the Rpon signal is high the enable signals on lines 1800 from the clock enable control logic 1406 in FIG. 14, select the scan data input signals on lines 1801 which in-turn keep the enable signals on lines 1800 low until each scan data input on the lines 1405 transition low, as was described with respect to FIG. 16.

Notwithstanding the embodiments and methods above, it is contemplated that the present invention may be used with any or all of the existing scan based methods and test techniques, including scan test compression, BIST, hierarchical scan structures, and any other traditional scan techniques either referred to in this patent, and other patents or papers readily available to the industry. In all such cases it is expected that the testing time would be reduced, by the addition of these techniques.

SUMMARY

Using existing scan test design, and by inserting Exclusive-Or gates periodically within the scan strings such that the scanned data is Exclusive-Ored with a selection of the input data, shift clocking need only proceed until the required inputs match the shifted values. Frequent taps from the scan strings into check-sums and/or signature registers serve to limit the required number of shifts necessary to capture the required "care output" values. These combined techniques significantly reduce the required number of shift clocks per pattern as compared to shift clocks required in prior art scan test techniques, thus significantly reducing the test time.

Further test time reductions obtained by breaking the scan strings into multiple commonly clocked scan strings with separate inputs. Variable scan clocking can be performed by including described scan clock control logic which enables scanning on each string to match each strings clocking requirements, without the need for additional pins.

The invention claimed is:

1. A method of testing an integrated circuit (IC) using test vectors containing a multiplicity of care inputs that are applied to at least one scan-chain of said IC, at least one said test vector containing a number of care inputs that is less than a total length of said test vector, wherein a last one of said care inputs occurs prior to a last position of said at least one test vector, each test vector having a corresponding predetermined expected test responses containing a multiplicity of care outputs, said method comprising, for each of said test vectors:

a. applying said test vector by applying serial data and clocking at least one said scan-chain only until all bits of said at least one said scan-chain that correspond to care inputs of said test vector have been set to values in accordance with said care inputs of said test vector;

b. operating said IC to capture at least one bit of a response of said IC to said test vector into at least one scan chain of said IC;

c. reading out at least some bits of said response of said IC to said test vector from said at least one scan-chain of said IC; and d. comparing the read out bits of said response of said IC to said test vector to bits of said predetermined expected test response corresponding to said test vector to determine a pass or fail status corresponding to said test vector, wherein said care output values are read out of a multiplicity of scan positions of said at least one scan-chain of said IC on successive clocks until all said care output values of said predetermined expected test response corresponding to said test vector in said at least one scan chain of said IC are read out.

2. A method of testing an IC as in claim 1, wherein a function of at least a subset of said multiplicity of said scan positions is used to read out said care output values on each clock.

3. A method of testing an IC as in claim 2, wherein said function is comprised of at least one of one or more direct connections and check-sums.

4. A method of testing an IC as in claim 3, wherein said at least one of one or more direct connections and check-sums are connected to one or more multi-input-signature-registers.

5. A method of testing an IC as in claim 1, wherein the step of reading out at least some bits of said response of said IC to said test vector occurs until all values of said care outputs have been read, and wherein the step of reading out at least some bits of said response of said IC to said test vector also comprises simultaneously applying a subsequent test vector.

6. A method of testing an IC as in claim 5, wherein, in the case of more than one scan chain, each of said scan-chains is independently clocked until all of its said care-outputs from the predetermined expected test response corresponding to the current response of said IC to said test vector have been read out and all of its said care inputs for the subsequent test vector have been set in accordance with said subsequent test vector.

7. A method of testing an IC as in claim 6, wherein each scan-chain's clock is independently enabled and disabled by a function, wherein the function, for each scan-chain, comprises a combination of a common clock, a common enable and the values of each of the respective scan-chain's test vectors.

8. A method of testing an integrated circuit (IC) using test vectors containing a multiplicity of care inputs that are applied to at least one scan-chain of said IC, each test vector having a corresponding predetermined expected test responses containing a multiplicity of care outputs, said method comprising, for each of said test vectors, the steps of:

applying said test vector by applying serial data and clocking at least one said scan chain only until all bits of said at least one said scan chain that correspond to care inputs of said test vector have been set to values in accordance with said care inputs of said test vector, wherein said step of applying serial data includes the step of inserting serial data into a multiplicity of scan positions within said at least one said scan-chain, and, wherein said step of inserting serial data into a multiplicity of scan positions is performed for each of said multiplicity of scan positions by applying a combination of a next bit value of said serial data and a present value of a scan bit previous to the scan position;

operating said IC to capture at least one bit of a response of said IC to said test vector into at least one scan chain of said IC;

reading out at least some bits of said response of said IC to said test vector from said at least one scan-chain of said IC; and comparing the read out bits of said response of said IC to said test vector to bits of said predetermined expected test response corresponding to said test vector to determine a pass or fail status corresponding to said test vector, wherein at least one value of said care inputs for at least one of said test vectors is set by using at least one captured response to a prior test vector.

9. A method of testing an IC as in claim 8, wherein said step of applying a combination includes the step of applying an exclusive-OR function to said next bit value of said serial data and said present value of a scan bit position previous to the scan position.

10. A method of testing an IC as in claim 8, wherein, for the case in which there are multiple scan-chains, said IC includes a multiplicity of scan-chain clocks, and wherein the method further comprises the step of:

enabling each of said scan-chain clocks by changing a state of the inputs to each of said scan-chains.

* * * * *